(12) United States Patent
Mori

(10) Patent No.: US 7,254,063 B2
(45) Date of Patent: Aug. 7, 2007

(54) NON-VOLATILE SEMICONDUCTOR MEMORY DEVICE AND METHOD FOR READING THE SAME

(75) Inventor: Toshiki Mori, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 161 days.

(21) Appl. No.: 11/215,049

(22) Filed: Aug. 31, 2005

(65) Prior Publication Data

US 2006/0098490 A1    May 11, 2006

(30) Foreign Application Priority Data

Nov. 9, 2004    (JP)    ............... 2004-325178

(51) Int. Cl.
*G11C 11/34*    (2006.01)
(52) U.S. Cl. ............ 365/185.22; 365/189.01; 365/185.29
(58) Field of Classification Search ......... 365/185.22, 365/189.01, 185.29, 185.14, 185.2
See application file for complete search history.

(56) References Cited

U.S. PATENT DOCUMENTS 6,222,762 B1 *   4/2001   Guterman et al. ..... 365/185.03
6,674,668 B2 *   1/2004   Ikehashi et al. ....... 365/185.24
6,839,279 B2     1/2005   Yamada

FOREIGN PATENT DOCUMENTS

JP    2001-67887 A    3/2001
JP    2003-242794 A   8/2003

* cited by examiner

*Primary Examiner*—Tuan T. Nguyen
*Assistant Examiner*—Dang Nguyen
(74) *Attorney, Agent, or Firm*—McDermott Will & Emery LLP

(57) ABSTRACT

In a reference cell 202, first and second cells 50 and 52 having the same structure as that of a memory cell are provided. A memory cell current IREF1 of the first cell 50 is set to be a minimum value of a memory cell current after an erase operation. A memory cell current IREF2 of the second cell 52 is set to be a maximum value of a memory cell current after a write operation. The read circuit 206 compares a memory cell current Icell with a current (IREF1+IREF2)/2 and outputs a comparison result. A current source for use in erase verification and write verification may be used in place of the first and second cells 50 and 52.

21 Claims, 20 Drawing Sheets

F I G. 1 3
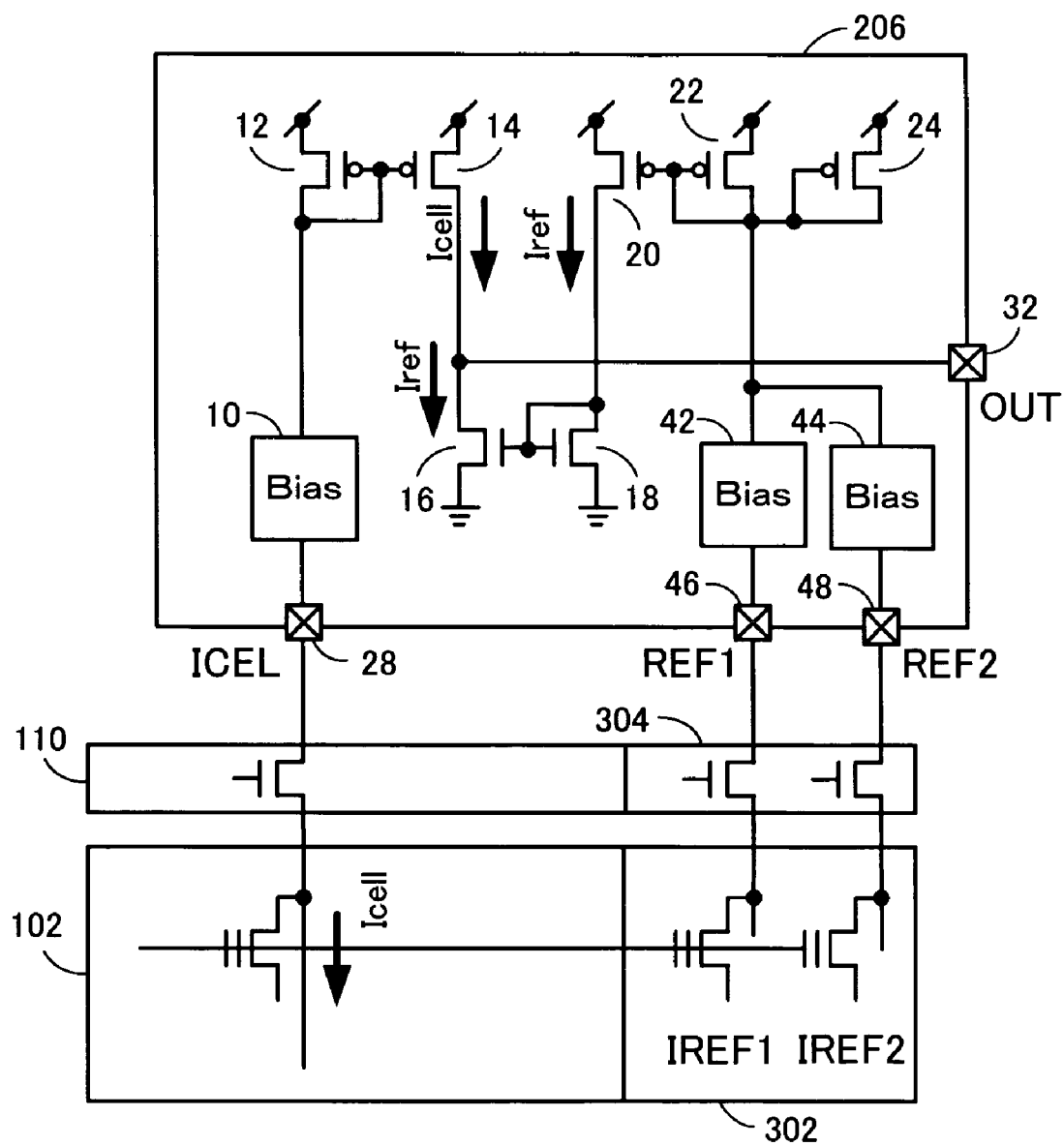

PRIOR ART

NON-VOLATILE SEMICONDUCTOR MEMORY DEVICE AND METHOD FOR READING THE SAME

BACKGROUND OF THE INVENTION

1. Field of the Invention

The present invention relates to a non-volatile semiconductor memory device. More particularly, the present invention relates to a method for reading the non-volatile semiconductor memory device, a method for setting a state of a reference cell, and a circuit for reading the non-volatile semiconductor memory device.

2. Description of the Background Art

Non-volatile semiconductor memory devices are capable of holding data after turning OFF a power source, and therefore, are widely used in information systems, communication systems and the like. Flash EEPROM is a type of non-volatile semiconductor memory device, from which data can be erased for an entire chip or only on a block-by-block basis where the block has a predetermined size. The flash EEPROM has a small memory cell size and low manufacturing cost, so that its demand is rapidly increasing.

A binary flash EEPROM controls the thresholds of memory cell transistors to store one-bit data in each memory cell. More specifically, the threshold of the memory cell transistor is controlled to be in different states so that a memory cell current when data "0" is stored is distinguished from a memory cell current when data "1" is stored. An intermediate current value between the memory cell current when data "0" is stored and the memory cell current when data "1" is stored is previously set as a read reference. By comparing a memory cell current during a read operation with the previously set read reference, it is determined whether read data is "0" or "1".

FIG. 28 is a diagram illustrating a distribution of a memory cell current in the binary flash EEPROM. In the binary flash EEPROM, each memory cell is set to be in one of two states (hereinafter referred to as a first state and a second state). A memory cell current in the first state and a memory cell current in the second state each have a distribution around a predetermined value as a center. A read reference IR is set to be somewhere in a range in which the two memory cell current distributions do not overlap (in FIG. 28, a range IW; hereinafter referred to as a read window), for example, the center of the read window. During a read operation, a memory cell current is compared with the read reference IR. When the memory cell current is smaller than the read reference IR, data is determined to be "1". Otherwise, read data is determined to be "0".

When a read operation is performed in the above-described method, it is desirable that the read reference is set to be at the center of the read window with high accuracy. However, the read reference is different from both the memory cell current in the first state and the memory cell current in the second state, and therefore, the read reference needs to be generated using a certain method. To generate the read reference, various methods have been used: a method based on a voltage generated by a reference voltage generation circuit; a method employing a transistor having a size or a structure different from that of an ordinary memory cell; a method of performing a write operation with respect to a memory cell which is composed of a transistor which is the same as that of an ordinary memory cell, in a manner different from that of the ordinary memory cell; and the like. However, it is difficult to set the read reference IR to be a desired value with high accuracy using any of these methods. Therefore, in order to broaden the width of the read window, measures are taken, such as setting the threshold of a write memory cell to be high, and the like.

In the above-described conventional reading methods using a read reference, it is necessary to set a sufficient margin between a memory cell current in each state and a read reference, taking into consideration variations in characteristics of memory cells during a manufacturing process, a difference in characteristics between a memory cell and a read reference generation circuit (a difference in voltage characteristics or temperature characteristics), a change over time in characteristics of a memory cell (a change in characteristics depending on the number of times of a write operation or an accumulated operating time), and the like. Therefore, in order to achieve a low voltage operation, a charge pump circuit is required which provides a voltage higher than a power source voltage to the control gate of a memory cell during a read operation. However, when the charge pump circuit is provided, an operating current increases.

Japanese Patent Laid-Open Publication No. 2001-67887 of the present inventors discloses a method for solving the above-described problems. According to this method, as illustrated in FIG. 29, an average value of a memory cell current in the first state is used as a first read reference REF1, and an average value of a memory cell current in the second state is used as a second read reference REF2. During a read operation, the degree of match between a memory cell current and the first read reference REF1 and the degree of match between the memory cell current and the second read reference REF2 are calculated. It is determined whether read data is "0" or "1", depending on which of the two degrees of match is higher than the other.

Thus, by using the average value of a memory cell current in each state as a read reference, the read reference can change, following the characteristics of the memory cell even when there are variations in characteristics of memory cells during a manufacturing process or a change in characteristics in an operating environment. Therefore, data can be read out with high accuracy, and a setting margin of a read reference and a fluctuation margin of characteristics can be reduced.

The above-described publication also discloses a semiconductor memory device in which, when a rewrite operation is performed with respect to a memory cell, a rewrite operation is also performed with respect to a memory cell which generates a read reference. In this semiconductor memory device, when characteristics of a memory cell are changed due to the rewrite operation, the read reference is also changed in association with this. Therefore, data can be read stably even when there are variations in characteristics of memory cells during a manufacturing process, a difference in characteristics between an ordinary memory cell and a memory cell for generating a read reference, a change over time in characteristics of a memory cell, or the like.

The state of a memory cell contained in a flash EEPROM is changed due to erase and write operations. Variations occur in the erase characteristics and the write characteristics of a memory cell contained in a flash EEPROM due to variations in memory cells during a manufacturing process, variations in power source voltage in a memory cell array, or the like. Also, the mutual conductance of a memory cell transistor varies, so that a memory cell current varies even when the threshold of the memory cell transistor is the same.

In the flash EEPROM, an erase operation is performed for an entire memory cell array or on a block-by-block basis where the memory cell array is divided into a plurality of blocks. In the latter case, an erase operation is performed equally for all memory cells in a block to be erased until they all pass through erase verification. Therefore, if there are variations in erase characteristics of memory cells in the block, variations also occur in the thresholds of memory cell transistors after an erase operation.

In contrast, in the flash EEPROM, a write operation is performed in units of several bits to several K bits which are called a word or a page. In this case, write verification is performed on a memory cell-by-memory cell basis, and a write operation with respect to a memory cell is controlled on a bit-by-bit basis. Therefore, a memory cell current after an erase operation is distributed in a wider range than that of a memory cell current after a write operation (see FIG. 30). Therefore, when an average value of a memory cell current after a write operation is represented by a first read reference REF1 and an average value of a memory cell current after an erase operation is represented by a second read reference REF2, the average value (REF1+REF2)/2 is not located at the center of the read window. Therefore, optimum read conditions are not necessarily obtained when an average value of memory cell currents in the states is used as a read reference.

SUMMARY OF THE INVENTION

Therefore, an object of the present invention is to a non-volatile semiconductor memory device capable of setting a read reference with higher accuracy and reading out data with higher accuracy, than that of conventional non-volatile semiconductor memory device.

A first aspect of the present invention is directed to, in a non-volatile semiconductor memory device comprising a plurality of memory cells, a method for reading data from the memory cell set in one of at least two states, comprising the steps of obtaining a read current of the memory cell to be read as a first current, obtaining a second current based on a first verification reference current used for erase verification of the memory cell and a second verification reference current used for write verification of the memory cell, and calculating data stored in the memory cell to be read, depending on whether the first current is larger than, smaller than, or equal to the second current.

In this case, the step of obtaining the second current may include obtaining a sum current of the first verification reference current and the second verification reference current as the second current, and the step of calculating the data may include comparing the first current with a half of the second current (or a double of the first current with the second current)

A second aspect of the present invention is directed to, in a non-volatile semiconductor memory device comprising a plurality of memory cells, a read circuit comprising a first current generation circuit of generating a first verification reference current used for erase verification of the memory cell, a second current generation circuit of generating a second verification reference current used for write verification of the memory cell, a first current supply circuit of supplying a read current as a first current to the memory cell to be read, a second current supply circuit of supplying a second current based on the first verification reference current and the second verification reference current, and a comparison section of calculating data stored in the memory cell to be read, depending on whether the first current is larger than, smaller than, or equal to the second current.

In this case, the second current supply circuit may supply a sum current of the first verification reference current and the second verification reference current as the second current. The comparison section may comprise a third current supply circuit of supplying a third current corresponding to the first current, a fourth current supply circuit of supplying a fourth current corresponding to the second current, and a comparison circuit of comparing the third current with the fourth current. More preferably, the third current may have the same amount as that of the first current, and the fourth current may be a half of the second current. Alternatively, the third current may be a double of the first current, and the fourth current may have the same amount as that of the second current.

A third aspect of the present invention is directed to, in a non-volatile semiconductor memory device comprising a plurality of memory cells and a plurality of reference cells, a method for reading data from the memory cell set in one of at least two states. A first reference cell is set so that a read current thereof coincides with a maximum or minimum value of a read current of the memory cell set in a first state, and a second reference cell is set so that a read current thereof coincides with a maximum or minimum value of a read current of the memory cell set in a second state. The method comprises the steps of obtaining a read current of the memory cell to be read as a first current, obtaining a second current based on the read current of the first reference cell and the read current of the second reference cell, and calculating data stored in the memory cell to be read, depending on whether the first current is larger than, smaller than, or equal to the second current.

In this case, the step of obtaining the second current may include obtaining a sum current of the read current of the first reference cell and the read current of the second reference cell as the second current, and the step of calculating the data may include comparing the first current with a half of the second current (or a double of the first current with the second current)

A fourth aspect of the present invention is directed to, in a non-volatile semiconductor memory device comprising a plurality of memory cells and a plurality of reference cells, a method for reading data from the memory cell set in one of at least three states. A first one of the reference cells is set so that a read current thereof coincides with a maximum or minimum value of a read current of the memory cell set in a first state. A second one of the reference cells is set so that a read current thereof coincides with a maximum or minimum value of a read current of the memory cell set in a second state. The remaining reference cell or cells are set so that a read current thereof coincides with a predetermined value. The method comprises the steps of obtaining a read current of the memory cell to be read as a first current, obtaining a second current based on the read current of the first reference cell and the read current of the second reference cell, obtaining a third current based on read currents of two of the reference cells other than the first reference cell, calculating a first comparison result, depending on whether the first current is larger than, smaller than, or equal to the second current, calculating a second comparison result, depending on whether the first current is larger than, smaller than, or equal to the third current, and calculating data stored in the memory cell to be read based on the first comparison result and the second comparison result.

In this case, the non-volatile semiconductor memory device may comprise at least four reference cells. A third one of the reference cells may be set so that a read current thereof coincides with a maximum value or a minimum value (or a representative value) of a read current of the memory cell set in the second state. A fourth one of the reference cells may be set so that a read current thereof coincides with a maximum value or a minimum value (or a representative value) of a read current of the memory cell set in a third state. The step of obtaining the second current may include obtaining a sum current of the read current of the first reference cell and the read current of the second reference cell as the second current. The step of obtaining the third current may include obtaining a sum current of the read current of the third reference cell and the read current of the fourth reference cell as the third current.

Alternatively, the non-volatile semiconductor memory device may comprise at least three reference cells. A third one of the reference cells may be set so that a read current thereof coincides with a maximum or minimum value of a read current of the memory cell set in a third state. The step of obtaining the second current may include obtaining a sum current of the read current of the first reference cell and the read current of the second reference cell as the second current. The step of obtaining the third current may include obtaining a sum current of the read current of the second reference cell and the read current of the third reference cell as the third current.

Alternatively, the step of calculating the first comparison result may include comparing the first current with a half of the second current, and the step of calculating the second comparison result may include comparing the first current with a half of the third current. Alternatively, the step of calculating the first comparison result may include comparing a double of the first current with the second current, and the step of calculating the second comparison result may include comparing a double of the first current with the third current.

A fifth invention of the present invention is directed to, in a non-volatile semiconductor memory device comprising a plurality of memory cells and a plurality of reference cells, a method for setting a state of the reference cell, comprising the steps of selecting one from the plurality of reference cells, setting all or a portion of the plurality of memory cells to be in a predetermined state, and determining whether a read current of the memory cell set in the predetermined state is larger than, smaller than, or equal to a read current of the selected reference cell, and changing a state of the selected reference cell until a result of the determination satisfies a predetermined condition.

In this case, the method may further comprise setting an initial state of the reference cell to be in an erased state. The step of changing the state of the reference cell may include performing a write operation with respect to the selected reference cell until the result of the determination satisfies the predetermined condition.

Alternatively, the step of changing the state of the reference cell may include changing the state of the selected reference cell until read currents of all (or a half number) of the memory cells set in the predetermined state are larger than or smaller than a read current of the selected reference cell.

Alternatively, the non-volatile semiconductor memory device may comprise a plurality of memory cell provided on respective intersections of a plurality of word lines and a plurality of bit lines, and a plurality of reference cells having the same structure as that of the memory cell and connected to the word lines. The step of setting the memory cell to be in the predetermined state may include setting all or a portion of the memory cells connected to the same word line as that of the selected reference cell.

A sixth aspect of the present invention is directed to, in a non-volatile semiconductor memory device comprising a plurality of memory cells, a read circuit comprising a first reference cell set so that a read current thereof coincides with a maximum or minimum value of a read current of the memory cell set in a first state, a second reference cell set so that a read current thereof coincides with a maximum or minimum value of a read current of the memory cell set in a second state, a first current supply circuit of supplying a read current as a first current to the memory cell to be read, a second current supply circuit of supplying a second current based on the read current of the first reference cell and the read current of the second reference cell, and a comparison section of calculating data stored in the memory cell to be read, depending on whether the first current is larger than, smaller than, or equal to the second current.

In this case, the second current supply circuit may supply, as the second current, a sum current of the read current of the first reference cell and the read current of the second reference cell. The comparison section may comprise a third current supply circuit of supplying a third current corresponding to the first current, a fourth current supply circuit of supplying a fourth current corresponding to the second current, and a comparison circuit of comparing the third current with the fourth current. More preferably, the third current may have the same amount as that of the first current, and the fourth current may be a half of the second current. Alternatively, the third current may be a double of the first current, and the fourth current may have the same amount as that of the second current.

A seventh aspect of the present invention is directed to a non-volatile semiconductor memory device comprising a plurality of memory cells provided on respective intersections of a plurality of word lines and a plurality of bit lines, and a plurality of reference cells having the same structure as that of the memory cell and connected to the word lines. After a state of the memory cell is set, a state of the reference cell is set based on a result of a read operation with respect to the memory cell connected to the same word line.

In this case, the non-volatile semiconductor memory device may further comprise a plurality of reference cell bit lines operating independently of the bit lines. The reference cell may be composed of a MOS transistor, and the reference cell may have a gate connected to the word line and a drain connected to the reference cell bit line.

An eighth aspect of the present invention is directed to, in a non-volatile semiconductor memory device comprising a plurality of memory cells and a plurality of reference cells, a method for reading data from the memory cell. The memory cells are divided into a first type such that the memory cell is set to be one of at least four states on a block-by-block basis, and a second type such that the memory cell is set to be one of at least two states. Each memory cell block is associated with at least four reference cells. The first to fourth reference cells of the first type memory cell are set so that respective read currents coincide with a maximum or minimum value of a read current of a memory cell set in one of the four states. The first and third reference cells of the second type memory cell are set so that respective read currents coincide with a maximum or minimum value of a read current of a memory cell set in one of the two states. The second and fourth reference cells of the second type memory cell are set so that respective read currents coincide with a maximum or minimum value of a read current of a memory cell set in the other of the two states. The method comprises the steps of obtaining a read current of the memory cell to be read as a first current, obtaining a second current based on the read current of the first reference cell and the read current of the second reference cell, obtaining a third current based on the read current of the second reference cell and the read current of the third reference cell, obtaining a fourth current based on the read current of the third reference cell and the read current of the fourth reference cell, and calculating data stored in the memory cell to be read, depending on whether the first current is larger than, smaller than, or equal to the second to fourth currents.

According to the present invention, a read reference can be set with high accuracy and data can be read out with high accuracy. Specifically, by setting a read reference to be a preferable value, an error does not occur during a read operation even under strict conditions, whereby data can be stably read out. Further, a significant difference is obtained between a read current and the read reference, resulting in a high-speed read operation and a low-voltage read operation. Furthermore, test conditions in a manufacturing process can be relaxed, thereby making it possible to improve the yield of a non-volatile semiconductor memory device and reduce cost.

According to the first and second aspects of the present invention, a read reference can be set with high accuracy by using a reference current used for erase verification and write verification without setting a read reference during a test before shipment, and data can be read out with high accuracy. According to the third to sixth aspects of the present invention, the state of a reference cell is set based on a memory cell current. Therefore, even when there are variations during a manufacturing process or a change in characteristics during an operation, a read reference can be set with high accuracy and data can be read out with high accuracy. Particularly, according to the fourth aspect of the present invention, a similar effect can be obtained for a multi-valued non-volatile semiconductor memory device. According to the seventh aspect of the present invention, a read reference is set on a block-by-block basis where the block is small, thereby making it possible to further improve the accuracy of setting the read reference. According to the eighth aspect of the present invention, methods of setting a read reference are switched, so that a portion of a non-volatile semiconductor memory device can be used as a binary or more memory, while the remaining portion can be used as a four- or more-valued memory.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a diagram illustrating details of a read circuit of the flash EEPROM of FIG. 11;

DESCRIPTION OF THE PREFERRED EMBODIMENTS

Figure 1:
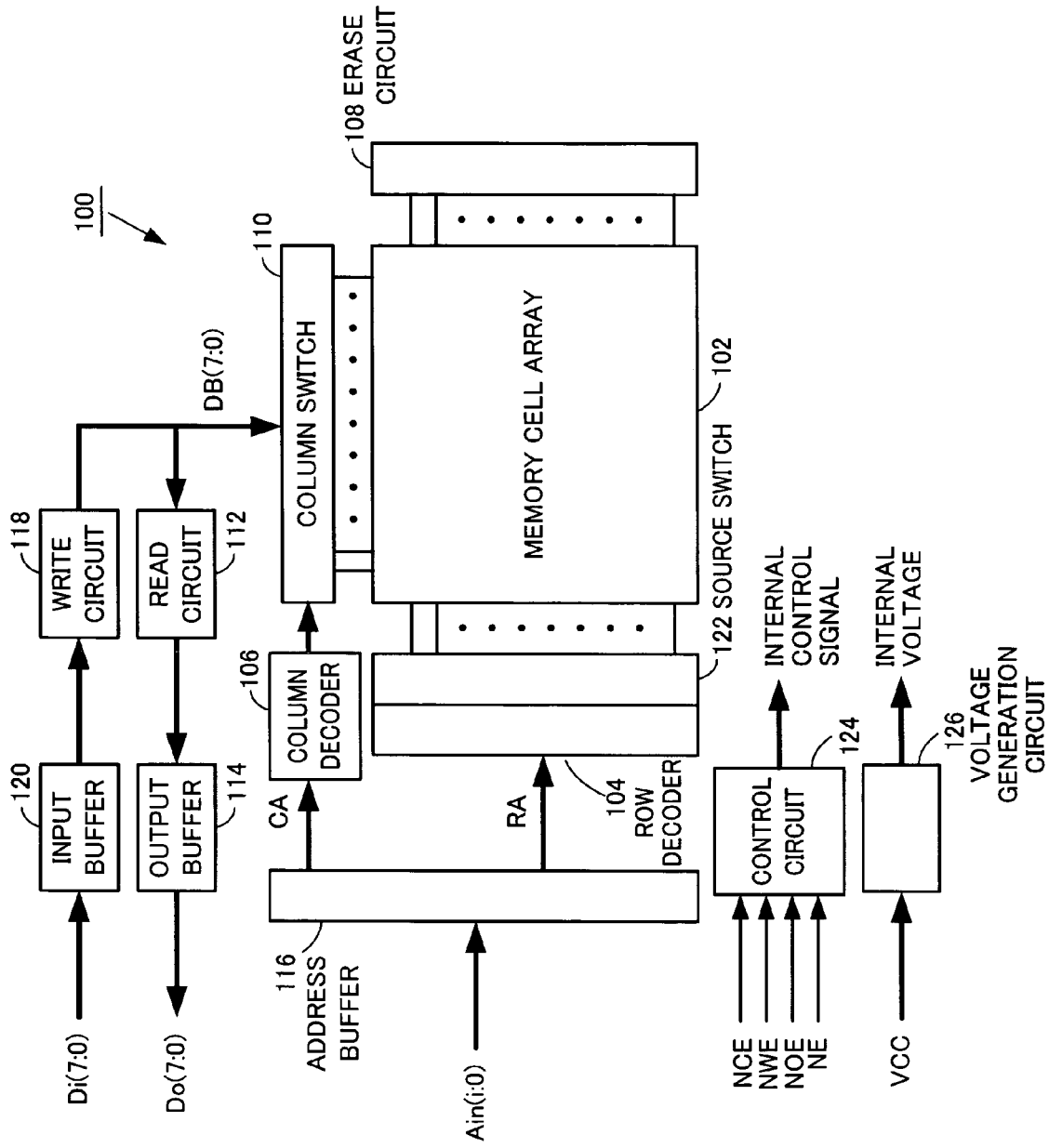
FIG. 1 is a diagram illustrating a structure of a flash EEPROM according to a first embodiment of the present invention.

Hereinafter, first to fifth embodiments of the present invention will be described with reference to the accompanying drawings. Note that like parts are designated by like reference numerals and will not be repeatedly explained.

First Embodiment

Figure 2:
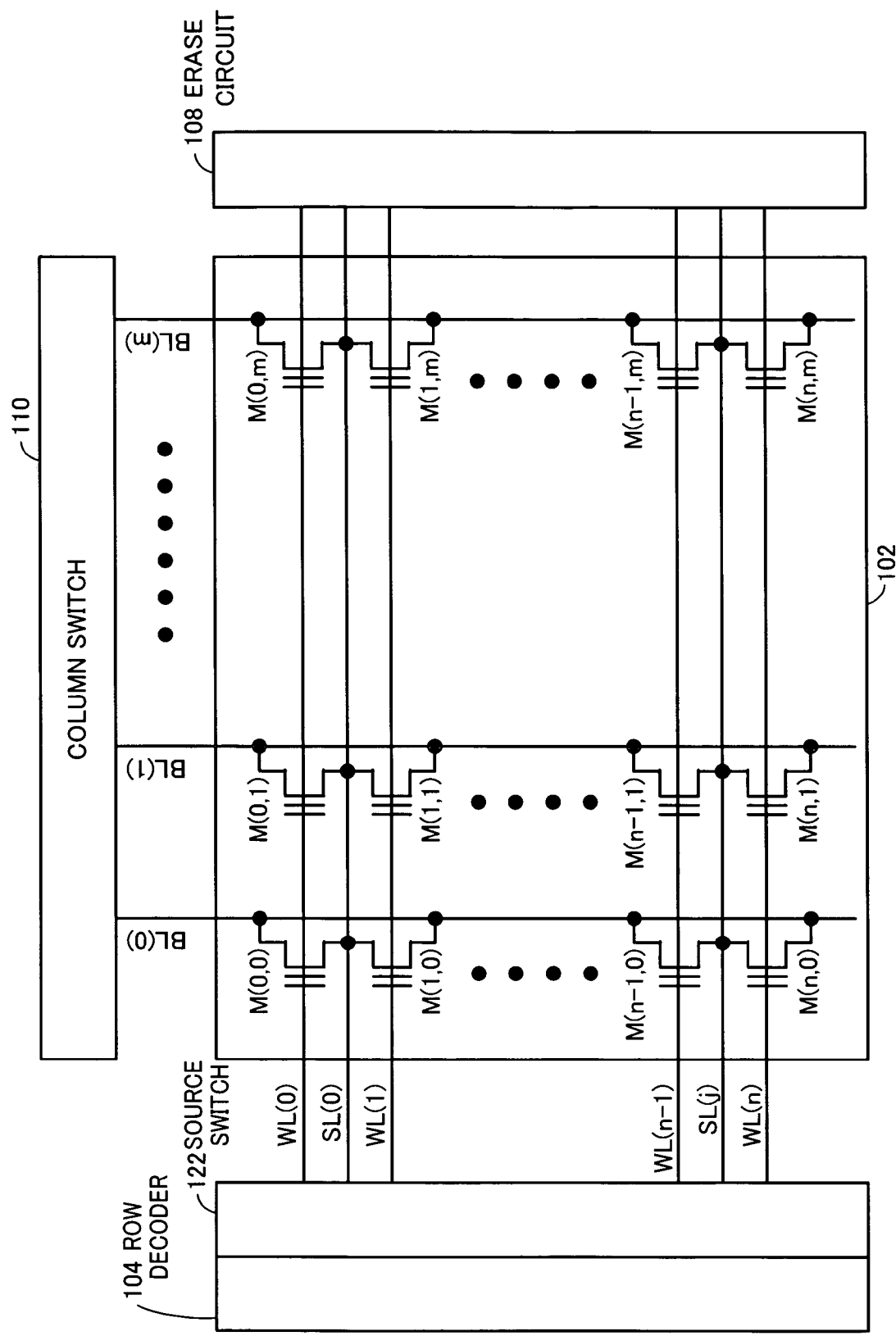
FIG. 2 is a diagram illustrating details of a memory cell array contained in the flash EEPROM of FIG. 1.

FIG. 1 is a diagram illustrating a structure of a flash EEPROM according to a first embodiment of the present invention. FIG. 2 is a diagram illustrating details of a memory cell array contained in the flash EEPROM of FIG. 1. In this and other embodiments, it is assumed that input/output data has a bit width of 8 bits in flash EEPROMs described below.

A flash EEPROM 100 of FIG. 1 comprises a memory cell array 102 for storing data. In the memory cell array 102, memory cell transistors M(0, 0) to M(n, m) having a double-gate structure are provided on corresponding intersections of word lines WL(0) to WL(n) and bit lines BL(0) to BL(m) (see FIG. 2). The control gates of memory cells provided on the same row are connected in common to a corresponding one of the word lines WL(0) to WL(n). The drains of memory cells provided on the same column are connected in common to a corresponding one of the bit lines BL(0) to BL(m). Two opposing sources of a pair of memory cells provided on the same column are formed by common source diffusion, and are connected in common to a corresponding one of source lines SL(0) to SL(j). Each memory cell transistor constitutes one memory cell.

A row decoder 104, an erase circuit 108 and a source switch 122 supply a required voltage to the word lines WL(0) to WL(n) and the source lines SL(0) to SL(j), depending on an operating mode of the flash EEPROM 100. The row decoder 104 receives a row address RA among address input signals input via an address input terminal Ain(i:0). The row decoder 104 decodes the row address RA, so that one designated word line is activated.

The bit lines BL(0) to BL(m) are each connected to a column switch 110. A column decoder 106 receives a column address CA among the address input signals input via the address input terminal Ain(i:0). The column decoder 106 decodes the column address CA, and outputs a result of decoding as a selection signal to the column switch 110. Based on the selection signal output from the column decoder 106, the column switch 110 connects eight of the bit lines BL(0) to BL(m) to a data path DB(7:0). As a result, the eight designated bit lines are connected to the data path DB(7:0).

A write circuit 118 and a read circuit 112 are connected to the data path DB(7:0) (see FIG. 1). For the sake of simplicity of FIG. 1, only one write circuit 118 and only one read circuit 112 are illustrated. Actually, eight write circuits 118 and eight read circuits 112 are provided, corresponding to the respective bits of the data path DB(7:0).

During a write operation, a write potential is applied via the data path DB(7:0) to eight selected bit lines so as to write data which is input via a data input terminal Di(7:0) and an input buffer 120. More specifically, of the eight selected bit lines, a bit line connected to a memory cell to be written receives a voltage of about +5 V, and a bit line connected to a memory cell not to be written receives a ground voltage. As a result, externally input data can be written into the eight selected memory cells in the memory cell array 102.

The read circuit 112 operates (1) when data is read from a selected memory cell during a read operation; (2) when data is read out for write verification during a writing operation; and (3) when data is read out for erase verification during an erase operation. When data is read out, 8-bit data is read out from eight memory cells selected from the memory cell array 102, via eight bit lines, the data path DB(7:0), an output buffer 114, and a data output terminal Do(7:0). In this case, the read circuit 112 applies a voltage of, for example, about +1 V to the eight selected bit lines in the memory cell array 102.

The flash EEPROM 100 further comprises a control circuit 124 and a voltage generation circuit 126. The control circuit 124 generates an internal control signal for controlling each circuit in the flash EEPROM 100 based on externally input control signals NCE, NOE, NWE and NE. The voltage generation circuit 126 generates an internal voltage required for each operating mode based on a power source voltage VCC.

Figure 3:
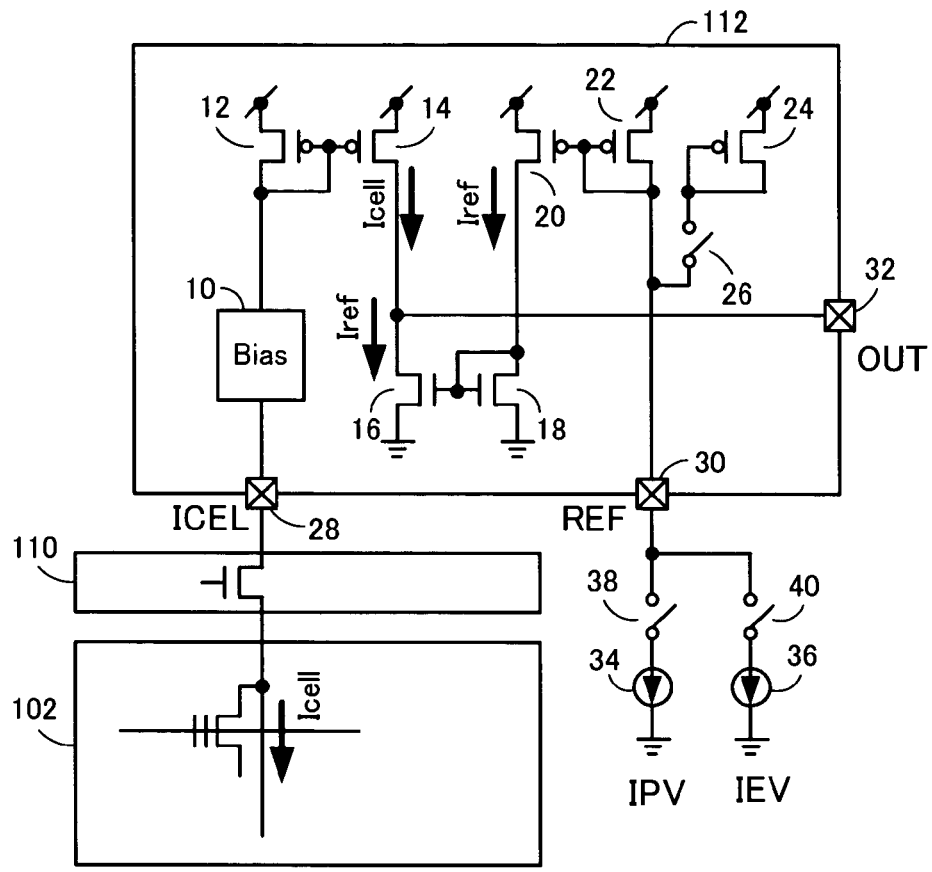
FIG. 3 is a diagram illustrating details of a read circuit in the flash EEPROM of FIG. 1.

FIG. 3 is a diagram illustrating details of the read circuit 112 corresponding to one-bit. The read circuit 112 comprises a read bias circuit 10, Pch transistors 12, 14, 20, 22, and 24, Nch transistors 16 and 18, a cell current input terminal 28, a reference current input terminal 30, and an output terminal 32.

A memory cell of the memory cell array 102 is connected via the column switch 110 to the cell current input terminal 28. The read bias circuit 10 applies a voltage of about +1 V (hereinafter referred to as a read bias) to a selected bit line during a read operation. When the read bias is applied to the selected memory cell, a memory cell current corresponding to data stored in the selected memory cell flows through a bit line connected to the selected memory cell. The memory cell current is supplied from the Pch transistor 12.

The Pch transistors 12 and 14 are each composed of a transistor having the same size, and form a first current mirror circuit. The Nch transistors 16 and 18 are each composed of a transistor having the same size, and form a second current mirror circuit. The Pch transistors 20, 22 and 24 are each composed of a transistor having the same size. The Pch transistor 22 is connected directly to, and the Pch transistor 24 is connected via a switch 26, to the Pch transistor 22. When the switch 26 is in the open state, the Pch transistor 20 and the Pch transistor 22 form a third current mirror circuit. When the switch 26 is in the conductive state, the Pch transistor 20 and the Pch transistors 22 and 24 form a fourth current mirror circuit. The Pch transistor 14 and the Nch transistor 16 are connected together in series, while the Nch transistor 18 and the Pch transistor 20 are connected together in series.

A memory cell current supplied from the Pch transistor 12 is hereinafter represented by Icell. Due to an action of the first current mirror circuit, a current supplied from the Pch transistor 14 has the same amount as that of the memory cell current Icell. A current supplied from the Pch transistor 20 is hereinafter represented by Iref. Due to an action of the second current mirror circuit, a current flowing through the Nch transistor 16 has the same amount as that of the current Iref.

A current source 34 is connected via a switch 38 to the reference current input terminal 30. Also, a current source 36 is connected via a switch 40 to the reference current input terminal 30. A write verification reference current IPV which is used for write verification flows through the current source 34. An erase verification reference current IEV which is used for erase verification flows through the current source 36.

During write verification, the switches 26 and 40 are set to be in the open state, while the switch 38 is set to be in the conductive state. In this case, the write verification reference current IPV is supplied from the Pch transistor 22, and due to actions of the second and third current mirror circuits, the current Iref flowing through the Pch transistor 20 and the Nch transistors 16 and 18 has the same amount as that of the write verification reference current IPV. Therefore, the Pch transistor 14 and the Nch transistor 16 are used to compare a current having the same amount as that of the memory cell current Icell with the current Iref having the same amount as that of the write verification reference current IPV. As a result, the output terminal 32 outputs a logic value "H" when the memory cell current Icell is larger, and otherwise, a logic value "L".

A write operation with respect to a memory cell is ended at the time when the memory cell current Icell becomes smaller than the write verification reference current IPV in the write verification.

During erase verification, the switches 26 and 38 are set to be in the open state, while the switch 40 is set to be in the conductive state. In this case, the erase verification reference current IEV is supplied from the Pch transistor 22, and due to actions of the second and third current mirror circuits, the current Iref flowing through the Pch transistor 20 and the Nch transistors 16 and 18 has the same amount as that of the erase verification reference current IEV. Therefore, the Pch transistors 14 and the Nch transistor 16 are used to compare a current having the same amount as that of the memory cell current Icell with the current Iref having the same amount as that of the erase verification reference current IEV.

An erase operation with respect to a memory cell is ended at the time when each memory cell current Icell becomes larger than the erase verification reference current IEV in the erase verification.

During a read operation, all of the switches 26, 38 and 40 are set to be in the conductive state. In this case, the Pch transistors 22 and 24 supply a current (IPV+IEV) which is a sum of the write verification reference current IPV and the erase verification reference current IEV. Of the current (IPV+IEV), a current supplied from the Pch transistor 22 shares a half of the sum current, i.e., (IPV+IEV)/2. Also, due to actions of the second and fourth current mirror circuits, the current Iref flowing through the Pch transistor 20 and the Nch transistors 16 and 18 has the same amount as that a half of the sum current, i.e., (IPV+IEV)/2. Therefore, the Pch transistor 14 and the Nch transistor 16 are used to compare a current having the same amount as that of the memory cell current Icell with the current Iref having the same amount as that of a half of the sum current, i.e., (IPV+IEV)/2.

Figure 4:
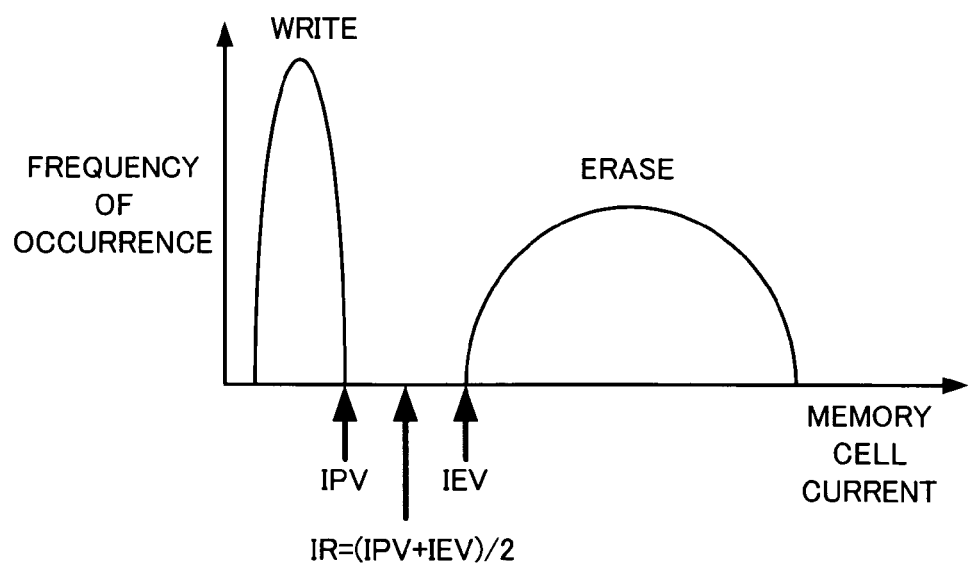
FIG. 4 is a diagram illustrating a memory cell current distribution and a read reference in the flash EEPROM of FIG. 1.

As described above, a minimum value of a memory cell current after an erase operation coincides with the erase verification reference current IEV, while a maximum value of a memory cell current after a write operation coincides with the write verification reference current IPV. During a read operation, a memory cell current is compared with (IEV+IPV)/2 which is an average value of a minimum value of a memory cell current after an erase operation and a maximum value of a memory cell current after a write operation (see FIG. 4).

Therefore, according to the flash EEPROM 100, it is possible to set a read reference to be at the center of the read window with high accuracy, thereby making it possible to read out data with high accuracy.

Figure 5:
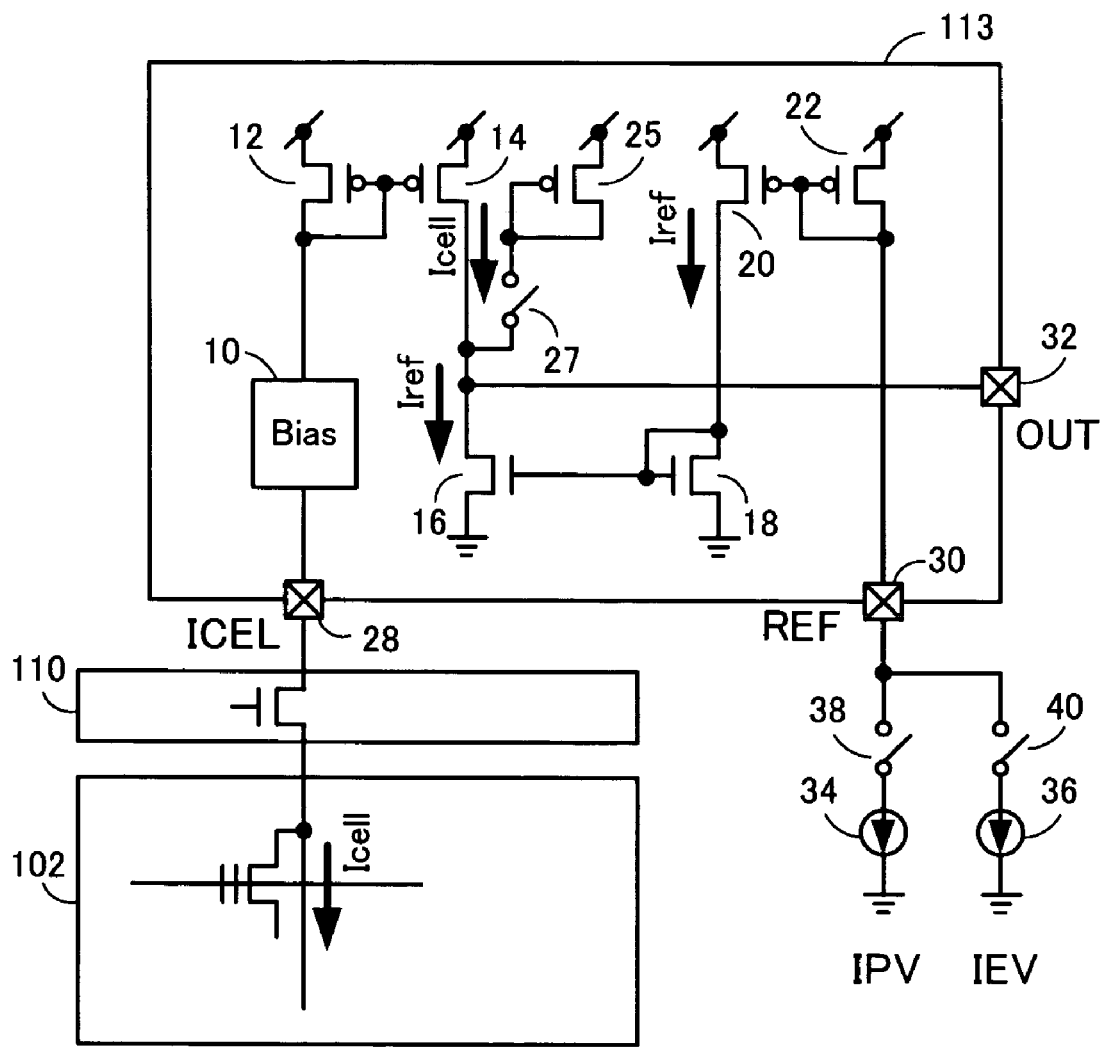
FIG. 5 is a diagram illustrating details of a read circuit of a flash EEPROM according to a variation of the first embodiment of the present invention.

Note that the flash EEPROM of the first embodiment may comprise a read circuit 113 of FIG. 5 in place of the read circuit 112. The read circuit 113 of FIG. 5 is different from the read circuit 112 (FIG. 3) in that a Pch transistor 25 is connected via a switch 27 to the Pch transistor 14 in the read circuit 113, while the Pch transistor 24 is connected via the switch 26 to the Pch transistor 22.

In FIG. 5, the Pch transistor 25 is composed of a transistor having the same size as that of the Pch transistors 12 and 14. When the switch 27 is in the open state, the Pch transistor 12 and the Pch transistor 14 form a first current mirror circuit. When the switch 27 is in the conductive state, the Pch transistor 12 and the Pch transistors 14 and 25 form a second current mirror circuit. The Nch transistors 16 and 18 form a third current mirror circuit. The Pch transistor 20 and 22 form a fourth current mirror circuit.

During write verification, the switches 27 and 40 are set to be in the open state, while the switch 38 is set to be in the conductive state. During erase verification, the switches 27 and 38 are set to be in the open state, while the switch 40 is set to be in the conductive state. Therefore, even when the read circuit 112 is replaced with the read circuit 113, the flash EEPROM 100 operates in the same manner during both write verification and erase verification.

During a read operation, all of the switches 27, 38 and 40 are set to be in the conductive state. In this case, the Pch transistor 22 supplies a current (IPV+IEV) which is a sum of the write verification reference current IPV and the erase verification reference current IEV. Due to actions of the third and fourth current mirror circuits, the current Iref flowing through the Pch transistor 20 and the Nch transistors 16 and 18 has the same amount as that of the sum current (IPV+IEV). Since the switch 27 is in the conductive state, the Pch transistor 25 supplies a current having the same amount as that of a current (having the same amount as that of the memory cell current Icell) supplied from the Pch transistor 12. Therefore, the Pch transistors 14 and 25 and the Nch transistor 16 are used to compare a current having an amount two times that of the memory cell current (2×Icell) with the current Iref having the same amount as that of the sum current (IPV+IEV).

Figure 6A:
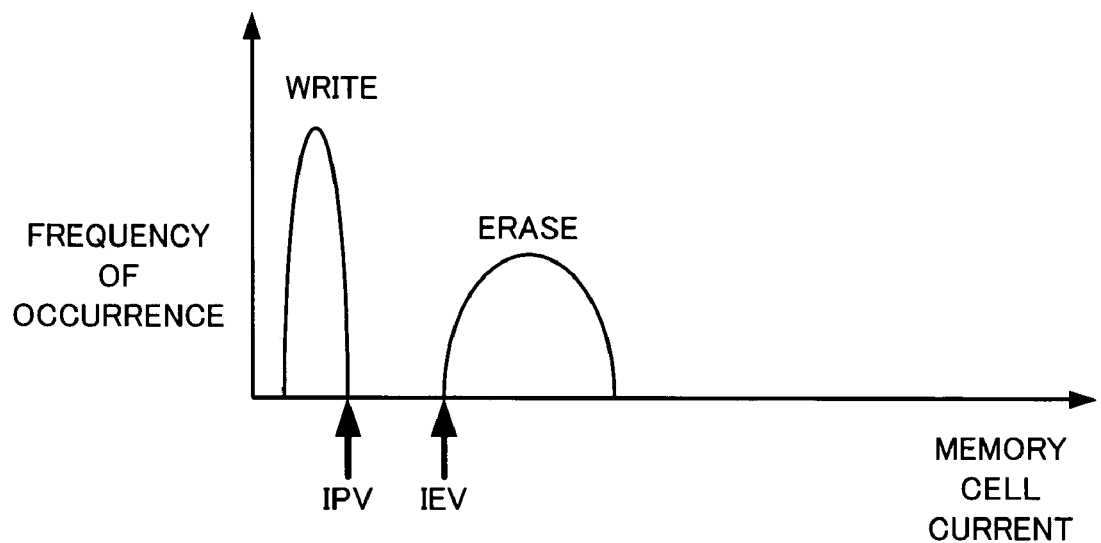
FIGS. 6A and 6B are diagrams illustrating details of a read circuit of a flash EEPROM according to a variation of the first embodiment of the present invention.
Figure 6B:
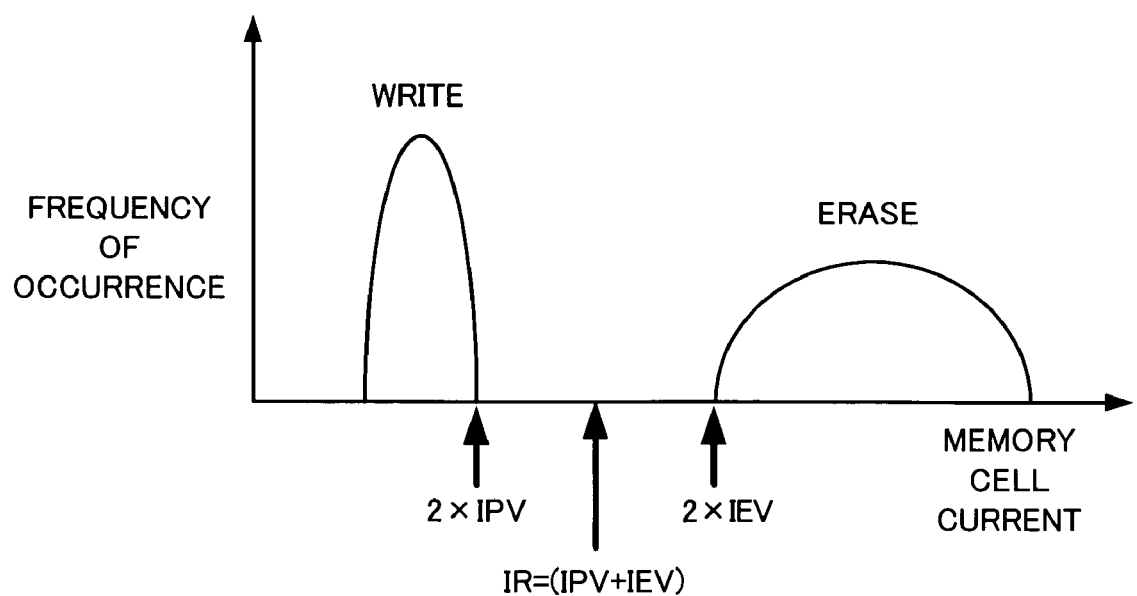

As described above, a minimum value of a memory cell current after an erase operation coincides with the erase verification reference current IEV, while a maximum value of a memory cell current after a write operation coincides with the write verification reference current IPV (see FIG. 6A). During a read operation, an amount two times that of a memory cell current is compared with a sum of the minimum value of a memory cell current after an erase operation and a maximum value of a memory cell current after a write operation (see FIG. 6B).

Therefore, even when the read circuit 112 is replaced with the read circuit 113, a read reference can be set to be at the center of the read window with high accuracy, thereby making it possible to read out data with high accuracy.

Second Embodiment

In a second embodiment, a flash EEPROM capable of setting a read reference with higher accuracy will be described. In the first embodiment, a method of setting a read reference using two current sources will be described. In general, a current source used in the first embodiment is composed of a transistor other than a double-gate structure transistor for use in a memory cell transistor, and a diode, a resistor, and the like. The reason is the following. If a double-gate structure transistor is used to construct a current source, a write operation needs to be performed with respect to a transistor contained in the current source in order to set a current flowing through the current source to be a predetermined value. However, a read reference which has been correctly set in advance is required to determine whether or not a write operation is correctly performed. Thus, there is a contradiction.

To avoid this situation, the write verification reference current IPV and the erase verification reference current IEV are produced using a MOS transistor, a diode, a resistor and the like based on an output voltage of a reference voltage generation circuit. A read current is compared with a current based on the above-described two currents. However, voltage characteristics or temperature characteristics vary among the memory cell transistor, the MOS transistor, the diode, the resistor and the like. Therefore, the accuracy of a read reference may be reduced due to a difference between write characteristics and erase characteristics. Also, pattern formation dimensions, film thickness, impurity concentration and the like which cause variations in characteristics during a manufacturing process vary among the memory cell transistor, the MOS transistor, the diode, the resistor and the like. The accuracy of a read reference may be reduced due to the variations during a manufacturing process. According to the flash EEPROM of the second embodiment, such a reduction in the accuracy of a read reference can be prevented.

Figure 7:
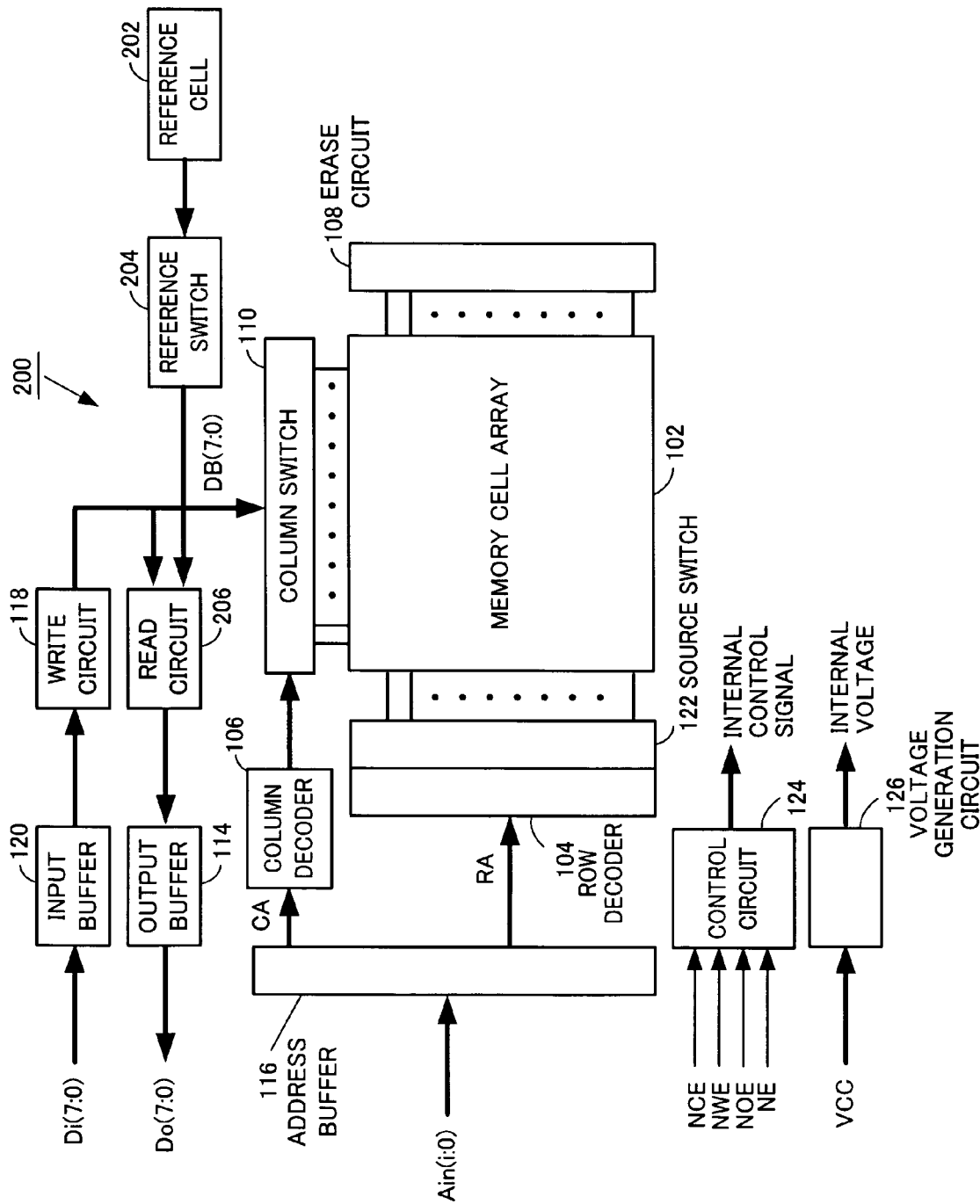
FIG. 7 is a diagram illustrating a structure of a flash EEPROM according to a second embodiment of the present invention.

FIG. 7 is a diagram illustrating a structure of the flash EEPROM of the second embodiment of the present invention. The flash EEPROM 200 of FIG. 7 is different from the flash EEPROM 100 of the first embodiment (FIG. 1) in that the read circuit 112 is replaced with a read circuit 206, and a reference cell 202 and a reference switch 204 are additionally provided.

Figure 8:
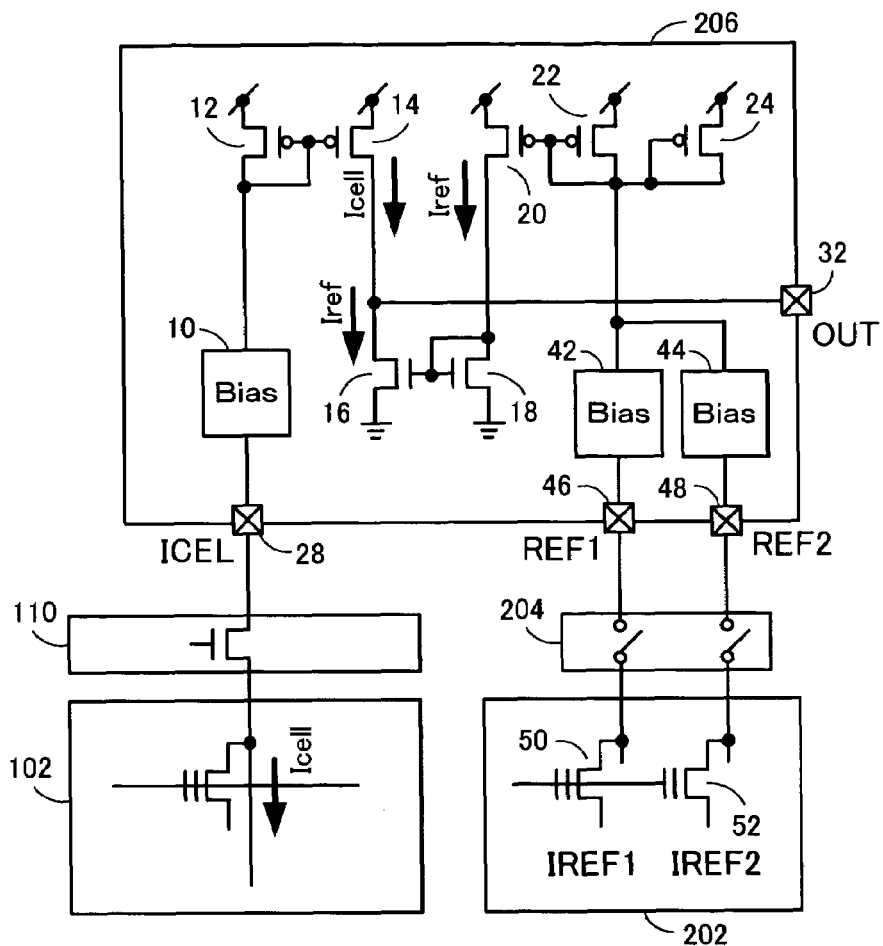
FIG. 8 is a diagram illustrating details of a read circuit of the flash EEPROM of FIG. 7.

FIG. 8 is a diagram illustrating details of the reference cell 202, the reference switch 204 and the read circuit 206. As illustrated in FIG. 8, the read circuit 206 is connected via reference current input terminals 46 and 48 and the reference switch 204 to the reference cell 202. The reference cell 202 includes a first cell 50 and a second cell 52. The first and second cells 50 and 52 are each composed of a double-gate structure transistor similar to that of a memory cell in the memory cell array 102. In the read circuit 206, Pch transistors 12 and 14 form a first current mirror circuit, and Nch transistors 16 and 18 form a second current mirror circuit. Further, a Pch transistor 20 and Pch transistors 22 and 24 form a third current mirror circuit.

Figure 9:
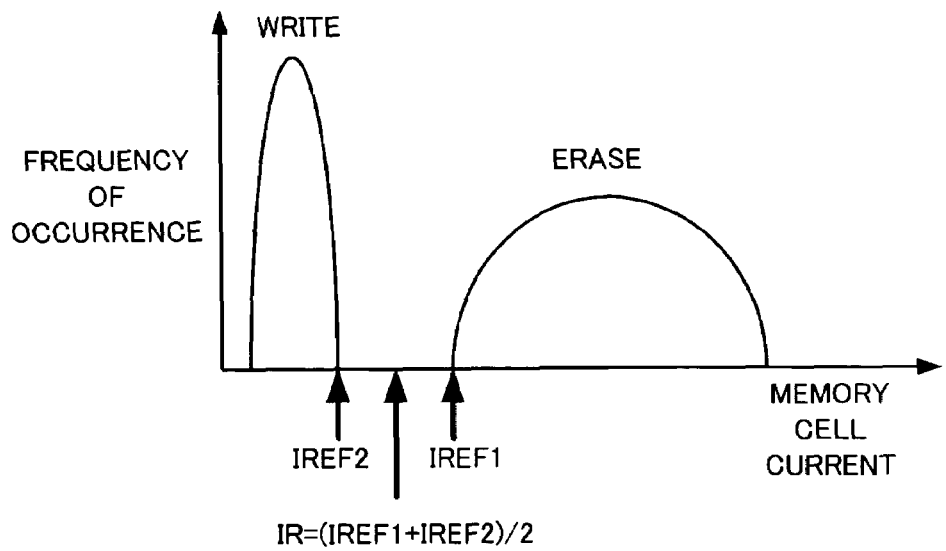
FIG. 9 is a diagram illustrating a memory cell current distribution and a read reference in the flash EEPROM of FIG. 7.

In the flash EEPROM 200, a memory cell current after an erase operation and a memory cell current after a write operation are distributed as illustrated in FIG. 9. In the flash EEPROM 200, in accordance with a process illustrated in FIG. 10, a memory cell current is set to coincide with a minimum value of a memory cell current after an erase operation in the first cell 50, while a memory cell current is set to coincide with a maximum value of a memory cell current after a write operation in the second cell 52. Hereinafter, the memory cell current of the first cell 50 is represented by IREF1 and the memory cell current of the second cell 52 is represented by IREF2.

Figure 10:
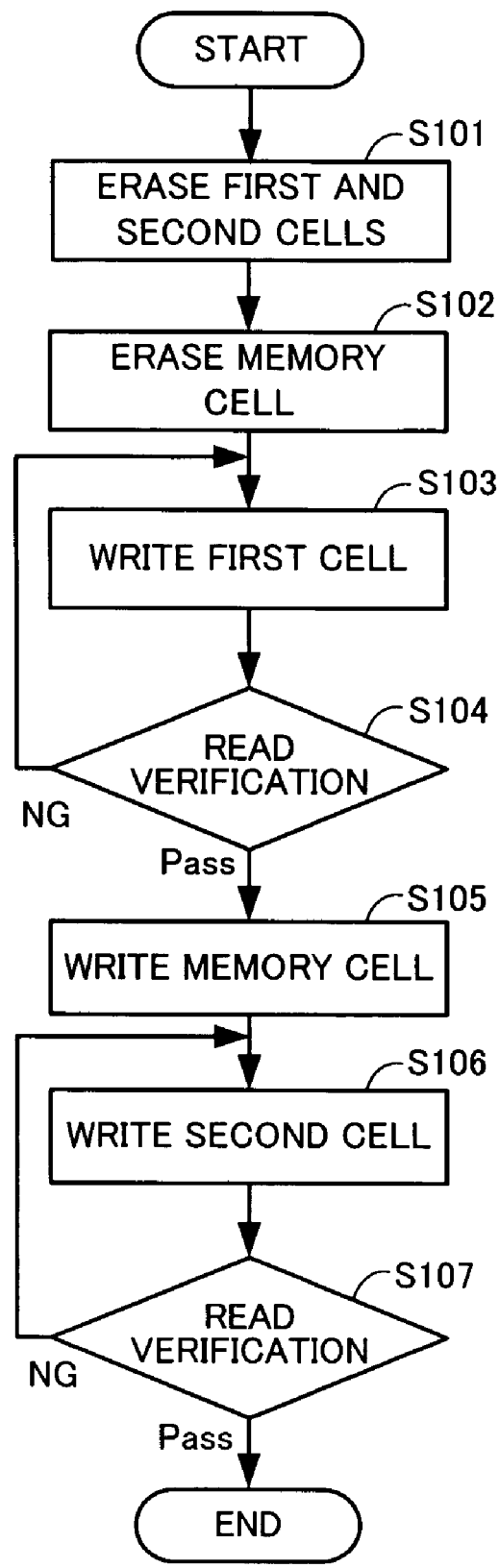
FIG. 10 is a flowchart illustrating a process of setting a state of a reference cell in the flash EEPROM of FIG. 7.

FIG. 10 is a flowchart illustrating a process of setting a state of a reference cell in the flash EEPROM 200. In this process, an erase operation is initially performed with respect to the reference cell 202, i.e., the first and second cells 50 and 52 (step S101). Note, in step S101, the first and second cells 50 and 52 may be erased to a greater extent than in an ordinary erase operation (i.e., so as to produce a larger memory cell current than in an ordinary erase operation), and high accuracy is not required for the degree of erase.

Next, an erase operation is performed with respect to a memory cell (step S102). A memory cell current after an erase operation is distributed as illustrated on a right portion of FIG. 9. Next, a write operation is performed with respect to the first cell 50 (step S103), and the current IREF1 is used as a read reference to perform read verification with respect to the memory cell after the erase operation (step S104). In step S104, when there is a memory cell whose memory cell current is smaller than the current IREF1, it is determined that the read verification fails. When the read verification fails (NG in step S104), a write operation is performed again with respect to the first cell 50 in step S103. Steps S103 and S104 are repeatedly performed until there is no remaining memory cell whose memory cell current is smaller than the current IREF1. Therefore, at the time when it is determined in step S104 that the read verification is successful (Pass in step S104), the current IREF1 coincides with a minimum value of a memory cell current after an erase operation.

Next, a write operation is performed with respect to a memory cell (step S105). A memory cell current after a write operation is distributed as illustrated in a left portion of FIG. 9. Next, a write operation is performed with respect to the second cell 52 (step S106), and the current IREF2 is used as a read reference to perform read verification with respect to the memory cell after the write operation (step S107). In step S107, when there is no memory cell whose memory cell current is larger than the current IREF2, it is determined that the read verification fails. When the read verification fails (NG in step S107), a write operation is performed again with respect to the second cell 52 in step S106. Steps S106 and S107 are repeatedly performed until a memory cell whose memory cell current is larger than the current IREF2 is encountered. Therefore, at the time when it is determined in step S107 that the read verification is successful (Pass in step S107), the current IREF2 coincides with a maximum value of a memory cell current after a write operation.

Note that, in steps S102 and S105, erase and write operations may be performed with respect to all memory cells in the memory cell array 102, or alternatively, erase and write operations may be performed with respect to a portion of memory cells in the memory cell array 102. Further, the process of FIG. 10 is typically performed when a flash EEPROM is tested before shipment. Alternatively, the process of FIG. 10 may be performed before a write operation with respect to a flash EEPROM.

By the process of FIG. 10, the memory cell current IREF1 of the first cell 50 is caused to coincide with a minimum value of a memory cell current after an erase operation, and the memory cell current IREF2 of the second cell 52 is caused to coincide with a maximum value of a memory cell current after a write operation. During a read operation, the currents IREF1 and IREF2 are used as read references to perform the following process.

As illustrated in FIG. 8, the control gates of the first and second cells 50 and 52 are connected to a common signal line. A gate voltage which is the same as that of the selected memory cell in the memory cell array 102 is applied to these control gates. Bias circuits 42 and 44 apply the same read bias as that of the selected memory cell in the memory cell array 102 to the first and second cells 50 and 52, respectively. Specifically, the bias circuits 42 and 44 apply a voltage of about +1 V to the first and second cells 50 and 52, respectively.

When the read bias is applied to the first and second cells 50 and 52, the Pch transistors 22 and 24 supply a current (IREF1+IREF2) which is a sum of the memory cell current IREF1 of the first cell 50 and the memory cell current IREF2 of the second cell 52. Of the current (IREF1+IREF2), the Pch transistor 22 supplies a current which is a half of the sum current, i.e., (IREF1+IREF2)/2. Therefore, similar to the read circuit 112 (FIG. 3), the Pch transistor 14 and the Nch transistor 16 are used to compare a current having the same amount as that of the memory cell current Icell with the current Iref having the same amount as that of a half of the sum current, i.e., (IREF1+IREF2)/2. As a result, the output terminal 32 outputs a logic value "H" when the memory cell current Icell is larger, and otherwise, a logic value "L".

As described above, the memory cell current IREF1 of the first cell 50 coincides with a minimum value of a memory cell current after an erase operation, while the memory cell current IREF2 of the second cell 52 coincides with a maximum value of a memory cell current after a write operation. During a read operation, a memory cell current is compared with an average value (IREF1+IREF2)/2 of a minimum value of a memory cell current after an erase operation and a maximum value of a memory cell current after a write operation (see FIG. 9).

Therefore, according to the flash EEPROM 200, a read reference can be set to be at the center of the read window with high accuracy, thereby making it possible to read out data with high accuracy.

Further, the read reference can be set based on a memory cell current after an erase operation and a memory cell current after a write operation, thereby making it possible to set the read reference with higher accuracy than that of the flash EEPROM of the first embodiment, so that data can be read with higher accuracy.

Furthermore, a reference cell is composed of a transistor having the same structure as that of an ordinary memory cell, so that voltage characteristics and temperature characteristics of a memory cell current are the same between an ordinary memory cell and the reference cell. Therefore, variations during a manufacturing process (e.g., variations in pattern formation dimensions or thickness in various films) are the same between an ordinary memory cell and the reference cell, thereby making it possible to achieve considerably high data read accuracy.

Third Embodiment

In a third embodiment, a flash EEPROM in which a reference cell and a memory cell array are disposed side by side will be described. In the second embodiment, a flash EEPROM comprising a reference cell composed of a transistor having the same structure as that of a memory cell is described. This flash EEPROM requires a circuit for supplying erase and write power sources to a reference cell. However, when a power source supply circuit specialized to a reference cell is provided, a circuit area is increased. Also, it is preferable that a read reference is provided on a block-by-block basis where each block is small, in order to further improve the accuracy of the read reference. According to the flash EEPROM of the third embodiment, such a problem can be solved.

Figure 11:
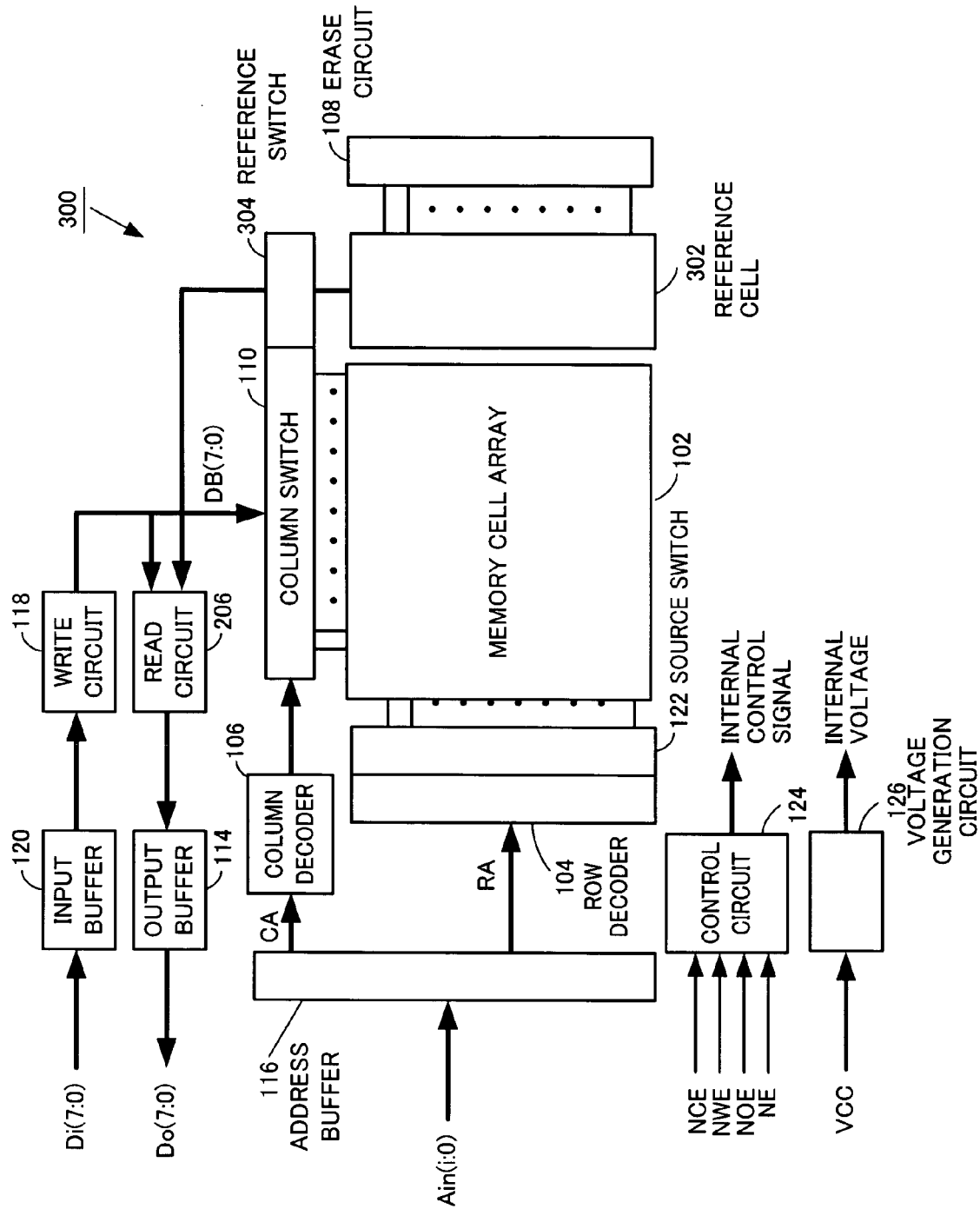
FIG. 11 is a diagram illustrating a structure of a flash EEPROM according to a third embodiment of the present invention.
Figure 12:
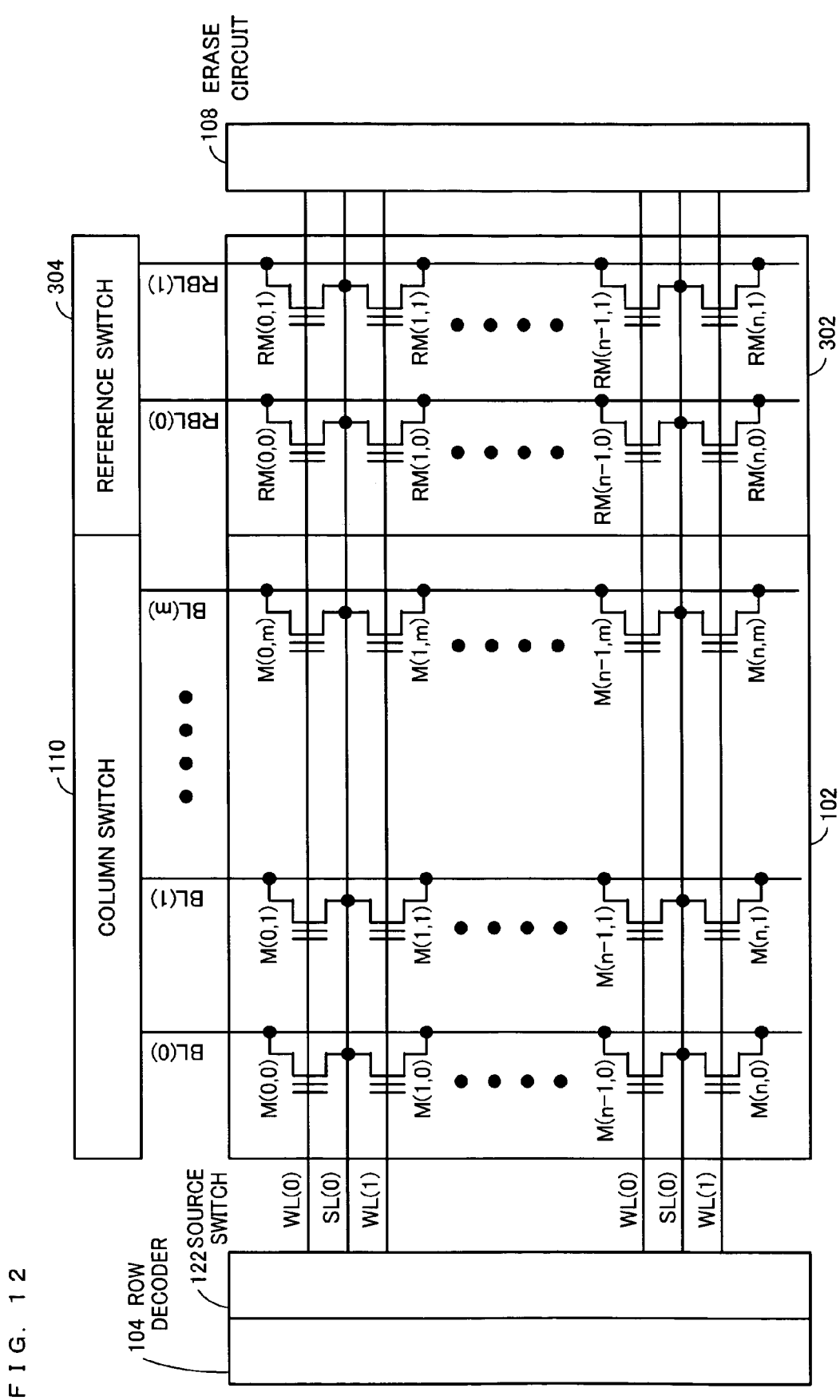
FIG. 12 is a diagram illustrating details of a memory cell array and a reference cell in the flash EEPROM of FIG. 11.

FIG. 11 is a diagram illustrating a structure of a flash EEPROM according to the third embodiment of the present invention. The flash EEPROM 300 of FIG. 11 is different from the flash EEPROM 200 of the second embodiment (FIG. 7) in the structures of a reference cell and a reference switch. FIG. 12 is a diagram illustrating details of a memory cell array and a reference cell contained in the flash EEPROM 300.

As illustrated in FIG. 11, a reference cell 302 and a memory cell array 102 are disposed side by side. More specifically, reference bit lines RBL(0) and RBL(1) which are operated independently of bit lines BL(0) to BL(m) of the memory cell array 102. Double-gate structure reference cell transistors RM(0, 0) to RM(n, 1) are provided on corresponding intersections of word lines WL(0) to WL(n) and the reference bit lines RBL(0) and RBL(1) (see FIG. 12). The drains of memory cell transistors provided on the same column are connected in common to the corresponding reference bit lines RBL(0) and RBL(1). The reference bit lines RBL(0) and RBL(1) are connected via a reference switch 304 to the read circuit 206.

Each reference cell of the reference cell 302 is set so that a memory cell current is caused to coincide with a predetermined value by the process for setting the state of a reference cell which is described in the second embodiment (FIG. 10). More specifically, a reference cell connected to the reference bit line RBL(0) is set so that a memory cell current thereof coincides with a minimum value of a memory cell current after an erase operation in a memory cell provided on the same row. A reference cell connected to the reference bit line RBL(1) is set so that a memory cell current thereof coincides with a maximum value of a memory cell current after a write operation in a memory cell provided on the same row. Note that, when the memory cell current of each reference cell is set, the memory cell currents of all memory cells provided on the same row may be referenced, or alternatively, the memory cell currents of a portion of the memory cells provided on the same row may be referenced.

During a read operation, when a certain word line WL(i) is activated, eight memory cells which are connected to the word line WL(i) and are designated with the column address CA and two reference cells which are connected to the word line WL(i) are brought into the selected state. A memory cell current corresponding to data stored in each of the eight selected memory cells flows through a bit line connected to the memory cell. A memory cell current having the same amount as the minimum value of a memory cell current after an erase operation in a memory cell connected to the word line WL(i) flows through the reference bit line RBL(0). A memory cell current having the same amount as a maximum value of a memory cell current after a write operation in a memory cell connected to the word line WL(i) flows through the reference bit line RBL(1).

FIG. 13 is a diagram illustrating details of the reference cell 302, the reference switch 304 and the read circuit 206. As illustrated in FIG. 13, the read circuit 206 is connected via the reference current input terminals 46 and 48 and the reference switch 304 to the reference cell 302. More specifically, the read circuit 206 is connected to two reference cells which are selected with a word line in the reference cell 302. The read circuit 206 operates in a manner similar to that of the second embodiment.

As described above, the current IREF1 flowing through the reference bit line RBL(0) coincides with a minimum value of a memory cell current after an erase operation of a memory cell provided on a certain row. The current IREF2 flowing through the reference bit line RBL(1) coincides with a maximum value of a memory cell current after a write operation of a memory cell provided on a certain row. During a read operation, a memory cell current is compared with the average value (IREF1+IREF2)/2 of a minimum value of a memory cell current after an erase operation and a maximum value of a memory cell current after a write operation of a memory cell on the same row on which a memory cell to be read is provided. Thus, in the flash EEPROM 300, a reference cell is provided for each word line of a memory cell array, and a read reference is set for memory cells connected on the same word line.

Therefore, according to the flash EEPROM 300, a read reference can be set on a block-by-block basis where each block is small, and the setting accuracy of a read reference can be further improved, without significantly increasing a circuit area.

Fourth Embodiment

In a fourth embodiment, a four-valued flash EEPROM will be described as an example of a multi-valued flash EEPROM. In the four-valued flash EEPROM, each memory cell is set to be in one of four states. Hereinafter, a state in which data "11" is stored is referred to as an erased state; a state in which data "10" is stored is referred to as a first written state; a state in which data "01" is stored is referred to as a second written state; and a state in which data "00" is stored is referred to as a third written state.

Figure 14:
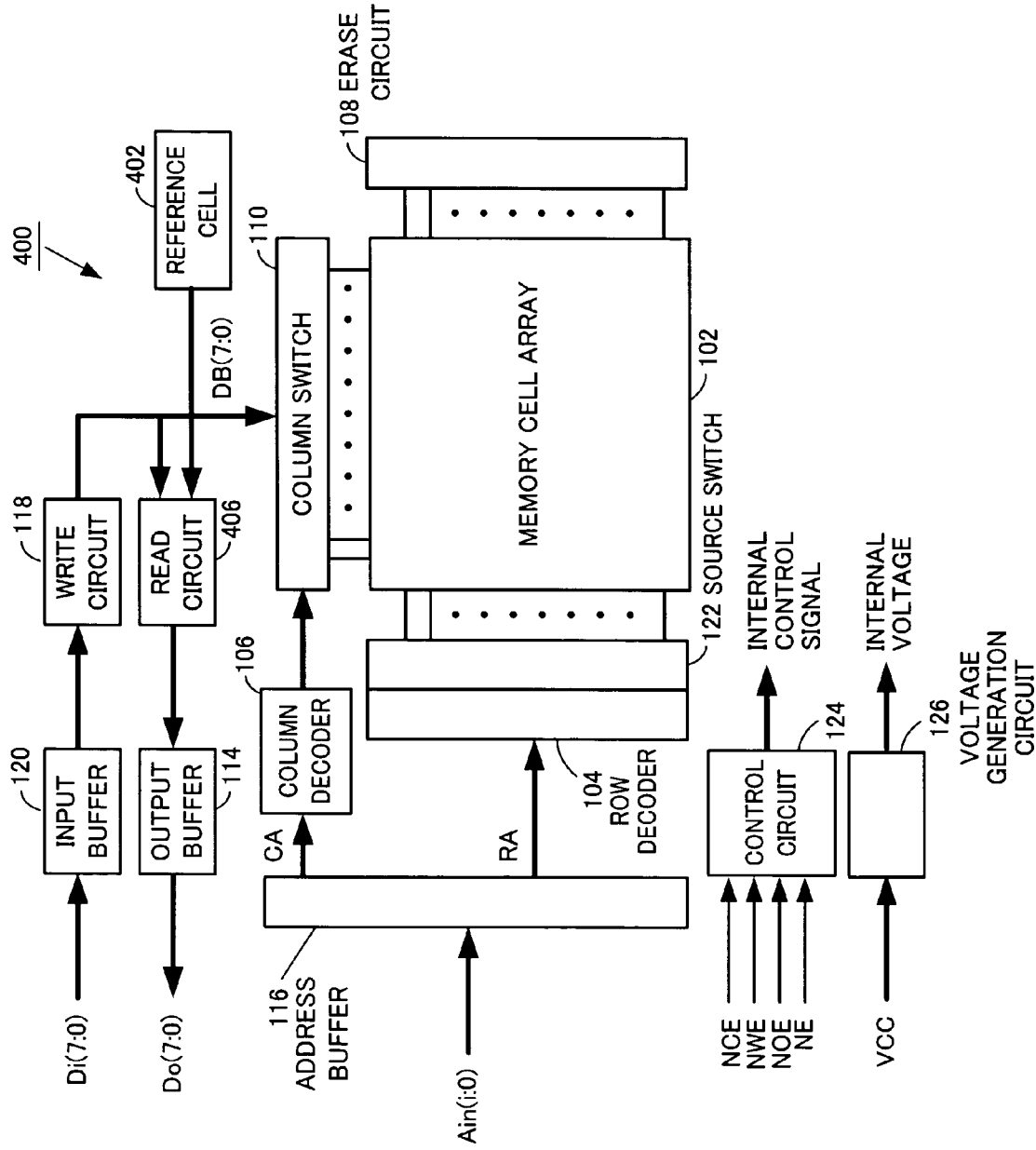
FIG. 14 is a diagram illustrating a structure of a flash EEPROM according to a fourth embodiment of the present invention.

FIG. 14 is a diagram illustrating a structure of a flash EEPROM according to a fourth embodiment of the present invention. The flash EEPROM 400 of FIG. 14 is different from the flash EEPROM 200 of the second embodiment (FIG. 7) in that the reference cell 202, the reference switch 204 and the read circuit 206 are replaced with a reference cell 402 and a multi-valued read section 406. The reference cell 402 includes first to sixth cells (not illustrated) each composed of a double-gate structure transistor similar to a memory cell in the memory cell array 102. Hereinafter, memory cell currents of the first to sixth cells are represented by IREF1 to IREF6, respectively.

Figure 15:
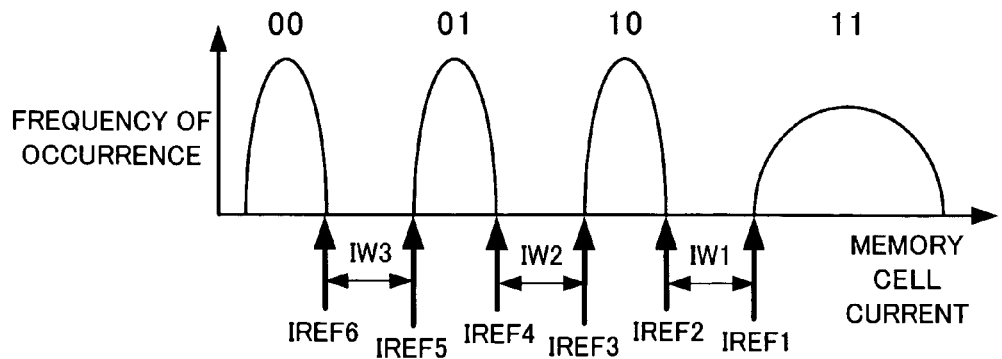
FIG. 15 is a diagram illustrating a memory cell current distribution and a read reference in the flash EEPROM of FIG. 14.

FIG. 15 is a diagram illustrating a memory cell current distribution in the flash EEPROM 400. In the flash EEPROM 400, a memory cell current is distributed in four ranges each around a predetermined value as a center, corresponding to the erased state and the first to third written states. For a reason similar to that of the binary flash EEPROM, a memory cell current in the erased state has a wider range than those of memory cell currents in the first to third written states.

In the flash EEPROM 400, in order to correctly read four-valued data, it is necessary to set a read reference somewhere in each of three read windows present between the four memory cell current distributions. As the number of possible states of a memory cell is increased, the width of each read window is narrowed. Therefore, the multi-valued flash EEPROM requires higher accuracy with which read references are set than that of the binary flash EEPROM.

Figure 18:
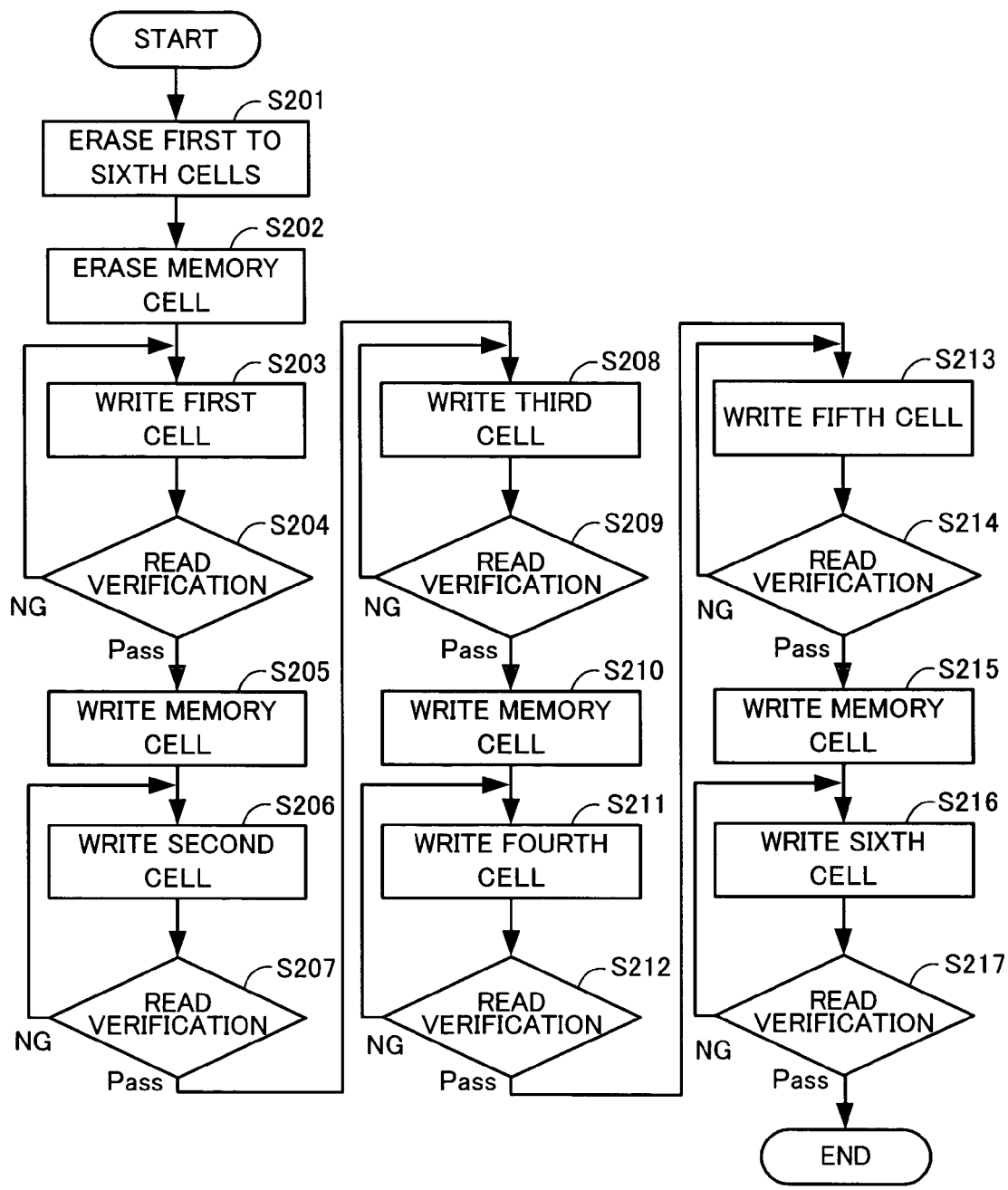
FIG. 18 is a flowchart illustrating a process for setting a state of a reference cell in the flash EEPROM of FIG. 14.

In the flash EEPROM 400, the first to sixth cells are set to coincide with a maximum or minimum value of a memory cell current in each of the above-described states as illustrated in FIG. 15, by a process for setting a state of a reference cell which is described below (FIG. 18). Specifically, the current IREF1 is set to be a minimum value of a memory cell current in the erased state. The current IREF2 is set to be a maximum value of a memory cell current in the first written state. The current IREF3 is set to be a minimum value of a memory cell current in the first written state. The current IREF4 is set to be a maximum value of a memory cell current in the second written state. The current IREF5 is set to be a minimum value of a memory cell current in the second written state. The current IREF6 is set to be a maximum value of a memory cell current in the third written state.

Figure 16:
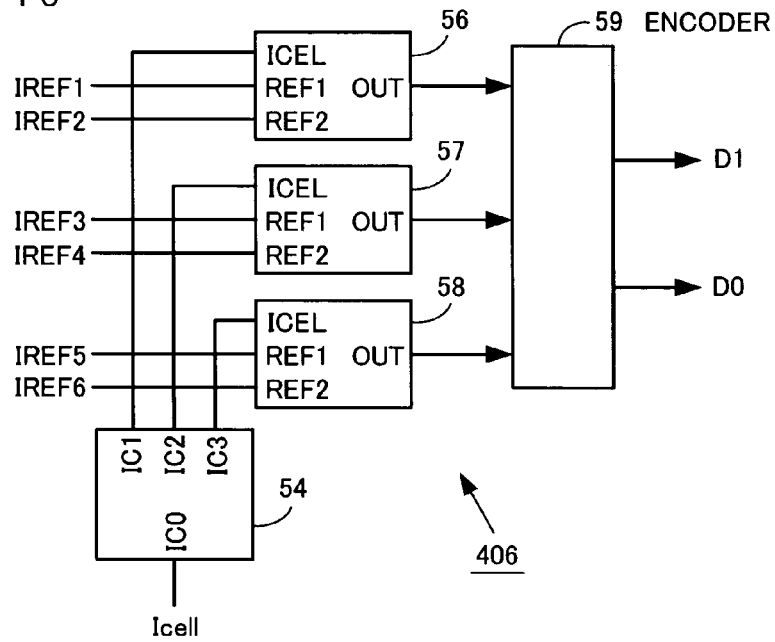
FIG. 16 is a diagram illustrating details of a multi-valued read section in the flash EEPROM of FIG. 14.

FIG. 16 is a diagram illustrating details of the multi-valued read section 406. As illustrated in FIG. 16, the multi-valued read section 406 comprises a current distributing circuit 54, read circuits 56 to 58, and an encoder 59. The current distributing circuit 54 has a function to flow a current having the same amount as that of the memory cell current Icell to three terminals IC1 to IC3. The read circuits 56 to 58 are each the same circuit as the read circuit 206 of FIG. 8. The read circuit 56 is connected to the first and second cells and the terminal IC1 of the current distributing circuit 54. The same is true of the read circuits 57 and 58.

Figure 17:
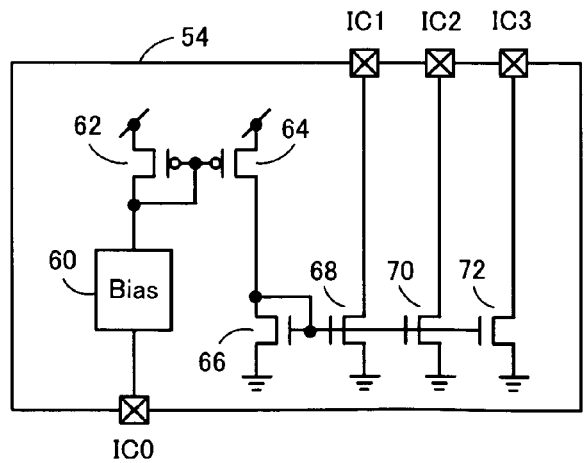
FIG. 17 is a diagram illustrating details of a current distributing circuit contained in the multi-valued read section of FIG. 15.

FIG. 17 is a diagram illustrating details of the current distributing circuit 54. A terminal IC0 of the current distributing circuit 54 is connected via a column switch 110 to a selected bit line in the memory cell array 102. A bias circuit 60 applies a voltage of about +1 V to a selected bit line during a read operation. When the read bias is applied to a selected memory cell in the memory cell array 102, a memory cell current flows corresponding to data stored in the selected memory cell. The memory cell current is supplied from a Pch transistor 62.

The Pch transistors 62 and 64 are each composed of a transistor having the same size, and form a first current mirror circuit. The Pch transistor 64 supplies a current having the same amount as that of a current (memory cell current) supplied from the Pch transistor 62 to an Nch transistor 66. The Nch transistors 66, 68, 70 and 72 are each composed of a transistor having the same size. The Nch transistor 66 and the Nch transistors 68, 70 and 72 form a second current mirror circuit. The Nch transistors 68, 70 and 72 each independently withdraw a current having the same amount as that of a current flowing through the Nch transistor 66 (i.e., a current having the same amount as a memory cell current) through the terminals IC1 to IC3.

Due to an action of the current distributing circuit 54, a current having the same amount as that of a memory cell current flows through a cell current input terminal ICEL of each of the read circuits 56 to 58. The read circuit 56 compares the current having the same amount as that of a memory cell current with a current (IREF1+IREF2)/2. The read circuit 57 compares the current having the same amount as that of a memory cell current with a current (IREF3+IREF4)/2. The read circuit 58 compares the current having the same amount as that of a memory cell current with a current (IREF5+IREF6)/2.

The encoder 59 encodes results of comparison performed by the read circuits 56 to 58. More specifically, the encoder 59 outputs encoding results D1 and D0 based on comparison results d1 to d3 of the read circuits 56 to 58 as follows.

{D1, D0}={1, 1} when {d1, d2, d3}={H, H, H}

{D1, D0}={1, 0} when {d1, d2, d3}={L, H, H}

{D1, D0}={0, 1} when {d1, d2, d3}={L, L, H}

{D1, D0}={0, 0} when {d1, d2, d3}={L, L, L}

FIG. 18 is a flowchart illustrating the process for setting the state of a reference cell in the flash EEPROM 400. In this process, initially, an erase operation is performed with respect to the reference cell 402, i.e., an erase operation is performed with respect to the first to sixth cells (step S201). Note that the erase operation does not require high accuracy, as is the case with the second embodiment. Next, an erase operation is performed with respect to a memory cell (step S202). A memory cell current after an erase operation is distributed as illustrated in a right portion of FIG. 15.

Next, a write operation is performed with respect to a first cell (step S203), and the current IREF1 is used as a read reference to perform read verification with respect to a memory cell after an erase operation (step S204). In step S204, when there is a memory cell whose memory cell current is smaller than the current IREF1, it is determined that read verification fails. When the read verification fails (NG in step S204), a write operation is performed again with respect to the first cell in step S203. Steps S203 and S204 are repeatedly performed until there is no remaining memory cell whose memory cell current is smaller than the current IREF1. Therefore, at the time when it is determined in step S204 that the read verification is successful (Pass in step S204), the current IREF1 coincides with a minimum value of a memory cell current after an erase operation.

Next, a write operation is performed with respect to a memory cell (step S205). In step S205, a write operation for setting the memory cell to be in the first written state (where data "10" is stored) is performed. A memory cell current after a write operation is distributed as illustrated in FIG. 15 (a second distribution from the right).

Next, a write operation is performed with respect to the second cell (step S206), and an erased memory cell is subjected to read verification using the current IREF2 as a read reference (step S207). In step S207, when there is no memory cell whose memory cell current is larger than the current IREF2, it is determined that the read verification fails. When the read verification fails (NG in step S207), a write operation is performed again with respect to the second cell in step S206. Steps S206 and S207 are repeatedly performed until a memory cell whose memory cell current is larger than the current IREF2 is encountered. Therefore, at the time when it is determined in step S207 that the read verification is successful (Pass in step S207), the current IREF2 coincides with a maximum value of a memory cell current in the first written state.

Next, in steps S208 to S212, the third and fourth cells are subjected to the same processes as those in steps S203 to S207, except that, in step S210, a written operation is performed to set a memory cell to be in the second written state (a state in which data "01" is stored). As a result, at the time when it is determined in step S212 that read verification is successful (Pass in step S212), the current IREF3 coincides with a minimum value of a memory cell current in the first written state, and the current IREF4 coincides with a maximum value of a memory cell current in the second written state.

Next, in steps S213 to S217, the fifth and sixth cells are subjected to the same processes as those in steps S203 to S207, except that, in step S215, a written operation is performed to set a memory cell to be in the third written state (a state in which data "00" is stored). As a result, at the time when it is determined in step S217 that read verification is successful (Pass in step S217), the current IREF5 coincides with a minimum value of a memory cell current in the second written state, and the current IREF6 coincides with a maximum value of a memory cell current in the third written state.

As described above, by the process illustrated in FIG. 18, the memory cell currents IREF1 to IREF6 in the first to sixth cells coincide with a maximum or minimum value of a memory cell current in the respective states (see FIG. 15). During a read operation, a memory cell current is compared with three currents (IREF1+IREF2)/2, (IREF3+IREF4)/2 and (IREF5+IREF6)/2, and based on three comparison results, read data is calculated.

Therefore, for a multi-valued flash EEPROM which has read windows each having a narrow width and requires highly accurate setting of respective read references, the read references can be set at the center of the respective read windows, so that data can be read out with high accuracy.

Figure 19:
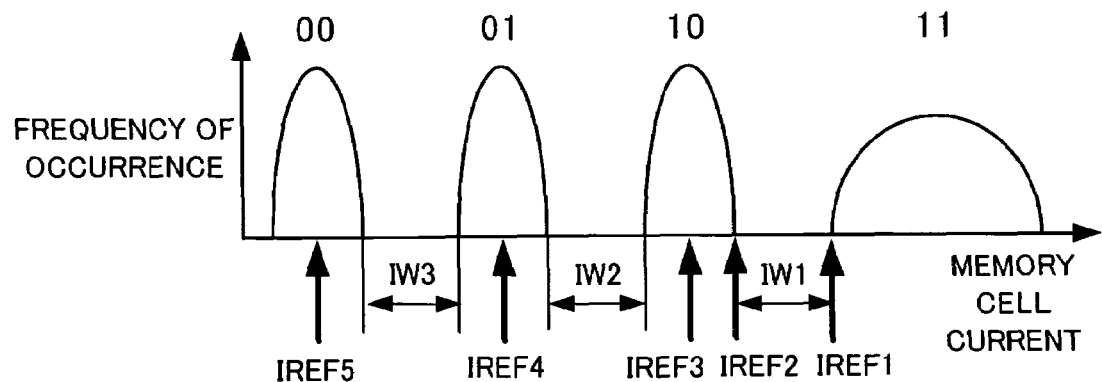
FIG. 19 is a diagram illustrating a memory cell current distribution and a read reference in a flash EEPROM according to a first variation of the fourth embodiment of the present invention.

Note that various variations of the flash EEPROM 400 can be constructed. As a first variation, a method is considered in which the memory cell currents IREF1 to IREF5 of the first to fifth cells are set as illustrated in FIG. 19. According to the setting method of FIG. 19, the current IREF1 is set to have a minimum value of a memory cell current after an erase operation, and the current IREF2 is set to have a maximum value of a memory cell current in the first written state. The currents IREF3 to IREF5 are set to have a center value of a memory cell current in the first to third written state, respectively.

In order to set the read references in the above-described manner, the process of FIG. 18 is changed as follows: (1) the process goes from step S212 to step S215; (2) the process is performed for the fifth cell in steps S216 and S217; (3) in steps S209, S212 and S217, it is determined that verification is successful if a half number of the memory cells verified pass the test.

Figure 20:
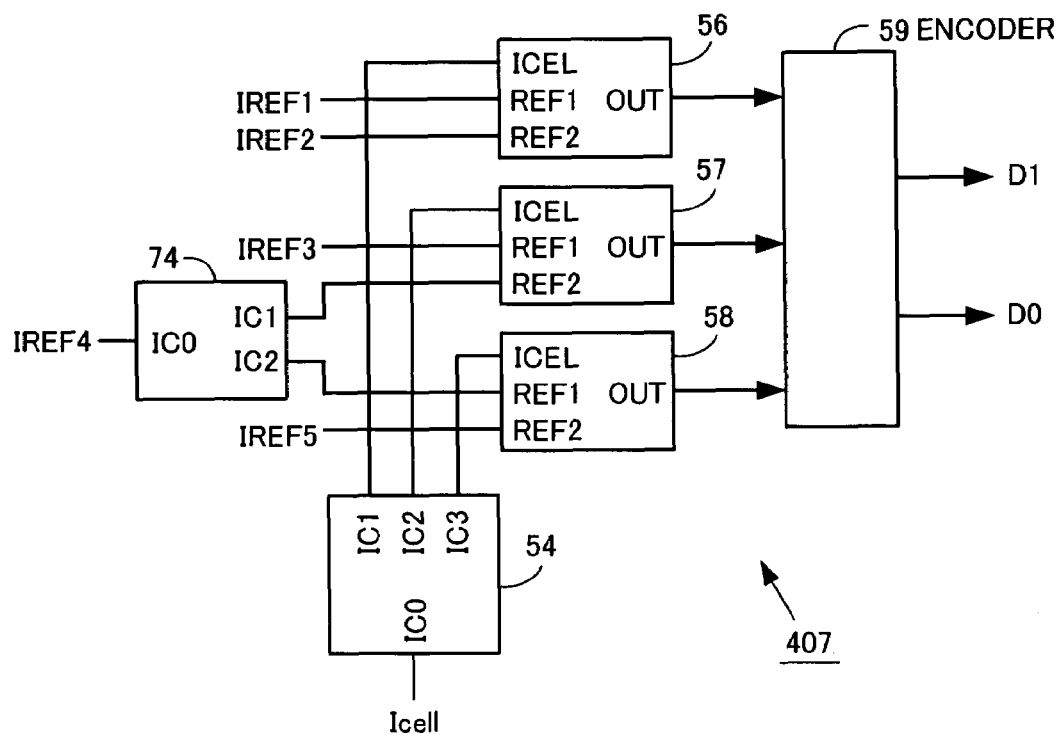
FIG. 20 is a diagram illustrating a multi-valued read section in a flash EEPROM according to the first variation of the fourth embodiment of the present invention.
Figure 21:
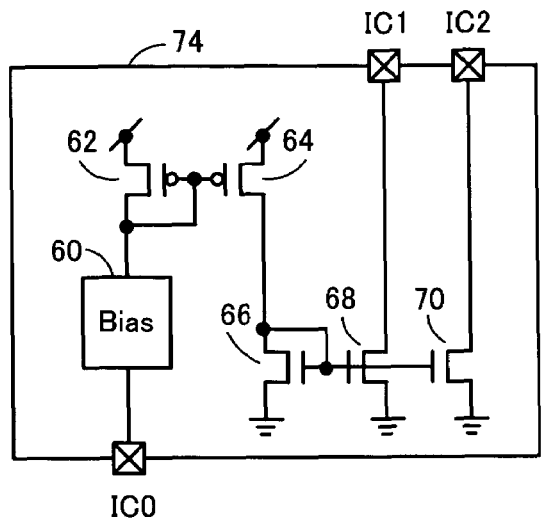
FIG. 21 is a diagram illustrating details of a current distributing circuit contained in the multi-valued read section of FIG. 20.

In the flash EEPROM of the first variation, a multi-valued read section 407 illustrated in FIG. 20 is employed in place of the multi-valued read section 406. The multi-valued read section 407 comprises current distributing circuits 54 and 74, read circuits 56 to 58, and an encoder 59. The current distributing circuit 74 is the same as the current distributing circuit 54 (FIG. 16), except that the Nch transistor 72 and the terminal IC3 are removed as illustrated in FIG. 21. The current distributing circuit 74 has a function to flow a current having the same amount as that of the current IREF4 to two terminals IC1 and IC2 based on a principle similar to that of the current distributing circuit 54. The read circuit 56 compares a current having the same amount as that of a memory cell current with a current (IREF1+IREF2)/2. The read circuit 57 compares a current having the same amount as that of a memory cell current with a current (IREF3+IREF4)/2. The read circuit 58 compares a current having the same amount as that of a memory cell current with a current (IREF4+IREF5)/2.

As illustrated in FIG. 19, the shape of the distribution of a memory cell current differs between the erased state and the first written state. However, the shape of the distribution of a memory cell current is the same between the first written state and the second written state. Therefore, the current (IREF3+IREF4)/2 is located at the center of a read window IW2 (a window located between the distribution in the first written state and the distribution in the second written state). Similarly, the current (IREF4+IREF5)/2 is located at the center of a read window IW3 (a window located between the distribution in the second written state and the distribution in the third written state)

Therefore, according to the flash EEPROM of the first variation, it is possible to set a read reference at the center of each read window with high accuracy and read out data with high accuracy, even when the number of reference cells is reduced to five.

Note that, in the flash EEPROM of the first variation, the currents IREF3 to IREF5 may be set to be an average value or a most frequent value of a memory cell current in the first to third written states, respectively.

Figure 22:
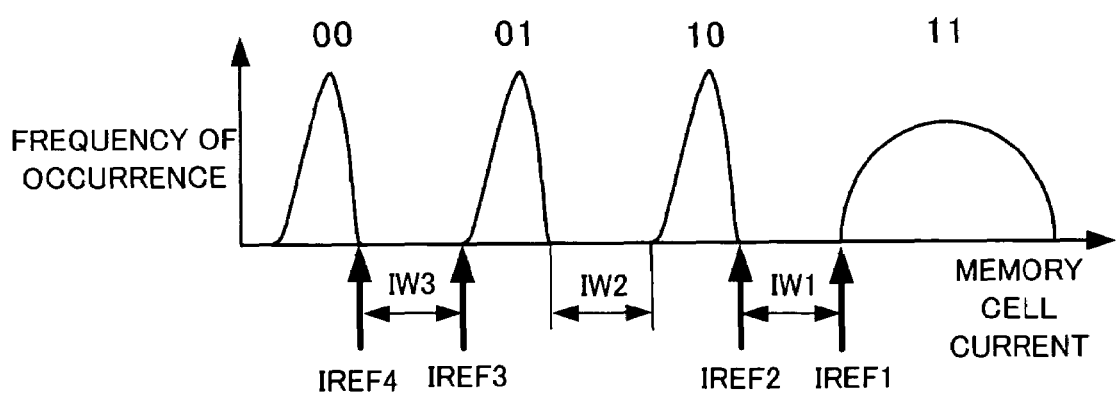
FIG. 22 is a diagram illustrating a memory cell current distribution and a read reference in a flash EEPROM according to a second variation of the fourth embodiment of the present invention.

Next, as a second variation, a method is considered in which the memory cell currents IREF1 to IREF4 of the first to fourth cells are set as illustrated in FIG. 22. According to the setting method of FIG. 22, the current IREF1 is set to be a minimum value of a memory cell current after an erase operation. The current IREF2 is set to be a maximum value of a memory cell current in the first written state. The current IREF3 is set to be a minimum value of a memory cell current in the second written state. The current IREF4 is set to be a maximum value of a memory cell current in the third written state.

In order to set the state of a reference cell in the above-described manner, the process of FIG. 18 may be changed as follows: (1) the process goes from step S207 to step S210; (2) the process goes from step S210 to step S213; (3) the third cell is processed in steps S213 and S214; and (d) the fourth cell is processed in steps S216 and S217.

Figure 23:
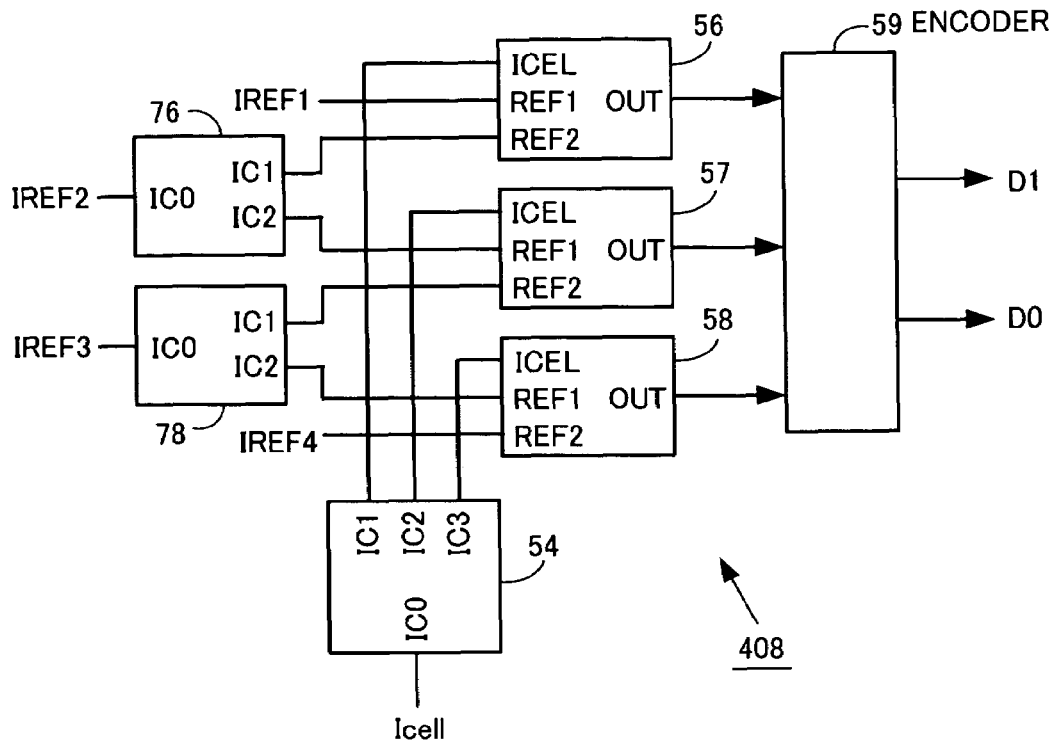
FIG. 23 is a diagram illustrating a multi-valued read section in the flash EEPROM according to the second variation of the fourth embodiment of the present invention.
Figure 24:
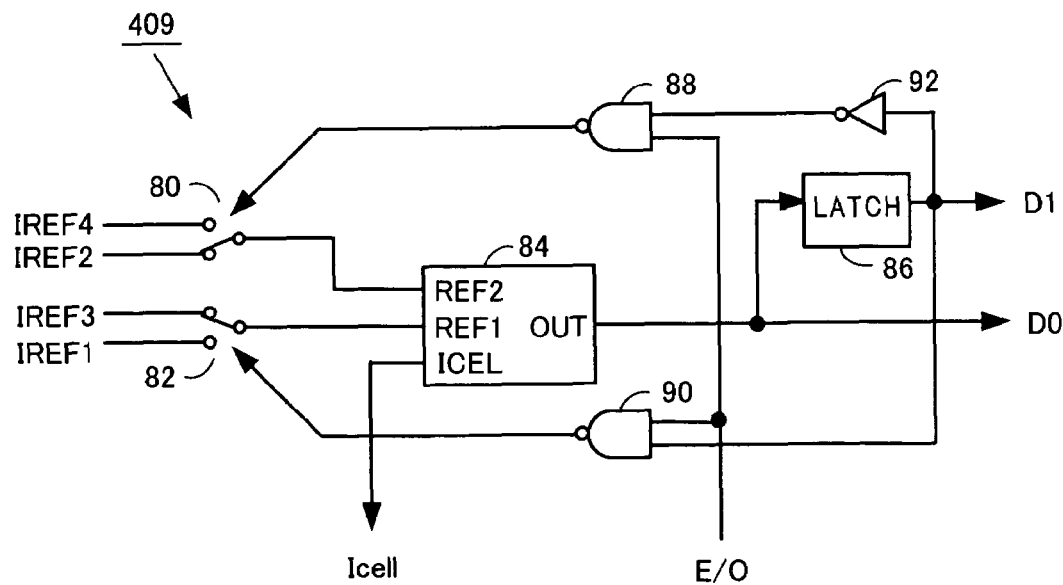
FIG. 24 is a diagram illustrating a multi-valued read section in a flash EEPROM according to a third variation of the fourth embodiment of the present invention.

In the flash EEPROM of the second variation, a multi-valued read section 408 of FIG. 23 is employed in place of the multi-valued read section 406. The multi-valued read section 408 comprises current distributing circuits 54, 76 and 78, read circuits 56 to 58, and an encoder 59. The current distributing circuits 76 and 78 are each the same circuit as the current distributing circuit 74. The read circuit 56 compares a current having the same amount as a memory cell current with a current (IREF1+IREF2)/2. The read circuit 57 compares a current having the same amount as a memory cell current with a current (IREF2+IREF3)/2. The read circuit 58 compares a current having the same amount as a memory cell current with a current (IREF3+IREF4)/2.

For a reason similar to that of the first variation, the current (IREF2+IREF3)/2 is located at the center of the read window IW2, and the current (IREF3+IREF4)/2 is located at the center of the read window IW3. This is achieved even when a memory cell current in each written state does not have a normal distribution (see FIG. 22).

Therefore, according to the flash EEPROM of the second variation, it is possible to set a read reference at the center of each read window with high accuracy and read out data with high accuracy, even when the number of reference cells is reduced to four. The above-described method of setting the state of a reference cell is particularly effective for a flash EEPROM in which a memory cell current in each written state does not have a normal distribution.

Further, as a third variation, a flash EEPROM can be considered in which a single read section is used to successively compare currents. For example, in a flash EEPROM in which four cells are contained in the reference cell 402, a multi-valued read section 409 may be employed in place of the multi-valued read section 408. The multi-valued read section 409 comprises switches 80 and 82, a read circuit 84, a latch 86, NAND gates 88 and 90, and an inverter 92. The switch 80 outputs one of the currents IREF2 and IREF4, and the switch 82 outputs one of the currents IREF1 and IREF3. The read circuit 84 is the same circuit as the read circuit 206 of FIG. 8, and a switch signal E/O is a signal for switching comparison levels.

At a first level, the switch signal E/O is "L", and the switch 80 outputs the current IREF2 and the switch 82 outputs the current IREF3. In this case, the read circuit 84 compares a memory cell current with a current (IREF2+IREF3)/2. A comparison result at the first level is latched in the latch 86. At a second level, the switch signal E/O is "H". When the comparison result at the first level is "H", the switch 80 continues to output the current IREF2, while the switch 82 switches an output from the current IREF3 to the current IREF1. Therefore, the read circuit 84 compares a memory cell current with a current (IREF1+IREF2)/2. In contrast, when the comparison result at the first level is "L", the switch 82 continues to output the current IREF3, while the switch 80 switches an output from the current IREF2 to the current IREF4. Therefore, the read circuit 84 compares a memory cell current with a current (IREF3+IREF4)/2. The multi-valued read section 409 outputs the comparison results at the first and second levels as the encoding results D1 and D0.

As described above, the multi-valued read section 409 performs comparison with respect to a memory cell current at the two levels, and outputs the results as the encoding results D1 and D0. Therefore, even when the multi-valued read section 408 is replaced with the multi-valued read section 409, the flash EEPROM performs the same operation.

Before shipment of a flash EEPROM comprising a reference cell, a state of a reference cell needs to be set. Therefore, by reducing the number of reference cells as in the first to third variations, a time required for a test before shipment can be reduced.

Fifth Embodiment

Figure 25:
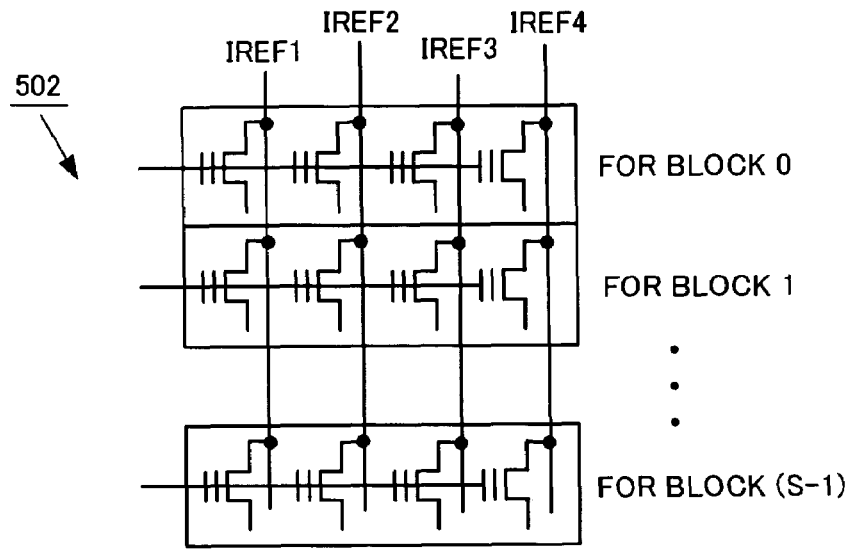
FIG. 25 is a diagram illustrating a reference cell in a flash EEPROM according to a fifth embodiment of the present invention.

In a fifth embodiment, a method will be described in which a portion of a flash EEPROM is composed of binary memories and the remaining portion thereof is composed of four-valued memories. The flash EEPROM of the fifth embodiment of the present invention is the same as the flash EEPROM of the fourth embodiment (FIG. 14) in that the reference cell 402 is replaced with a reference cell 502 (FIG. 25).

In the flash EEPROM of the fifth embodiment, memory cells in a memory cell array 102 are divided into a plurality of blocks (hereinafter assuming that the number of blocks is s). Each block is used as a binary memory or a four-valued memory. Hereinafter, a block used as a four-valued memory is referred to as a four-valued memory block, while a block used as a binary memory is referred to as a binary memory block. In a reference cell 502, each of the s blocks comprises four reference cells. The four reference cells are used when a read operation is performed with respect to a memory cell contained in each block.

Figure 26A:
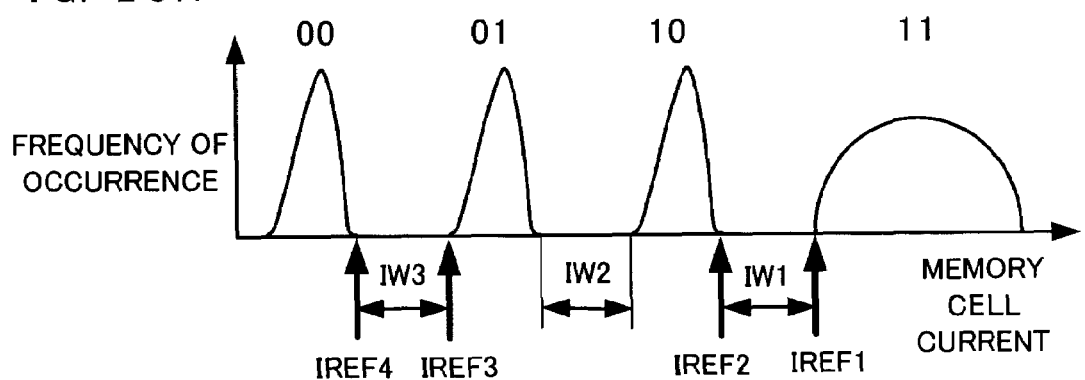
FIGS. 26A and 26B are diagrams illustrating a memory cell current distribution and a read reference in a flash EEPROM according to a fifth embodiment of the present invention.
Figure 26B:
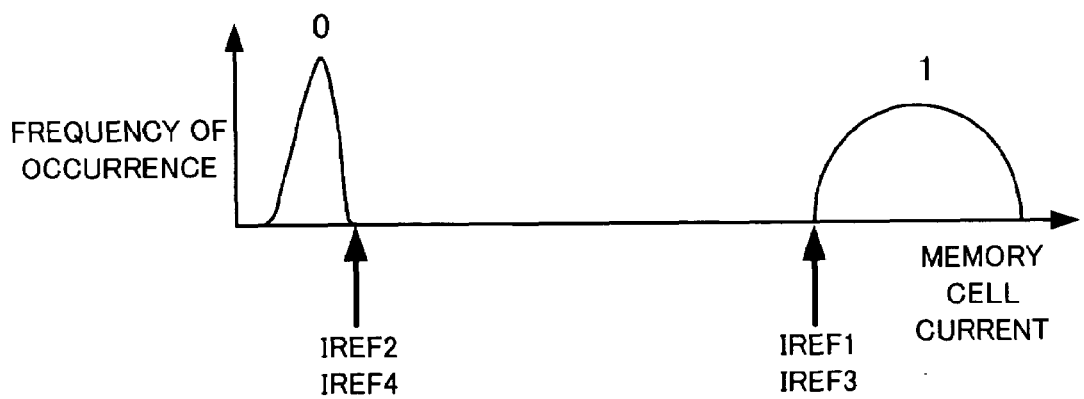

In the four-valued memory block, a memory cell current is distributed in four ranges around respective predetermined values as centers. Memory cell currents IREF1 to IREF4 of first to fourth cells are set by a process similar to that of the second variation of the fourth embodiment as illustrated in FIG. 26A. In contrast, in the binary memory block, a memory cell current is distributed in two ranges around respective predetermined values as centers. The memory cell currents IREF1 to IREF4 in the first to fourth cells are set by a process described below (FIG. 27) as illustrated in FIG. 26B. More specifically, the memory cell currents IREF1 and IREF3 are each set to be a minimum value of a memory cell current after an erase operation, while the memory cell currents IREF2 and IREF4 are each set to be a maximum value of a memory cell current after a write operation.

Figure 27:
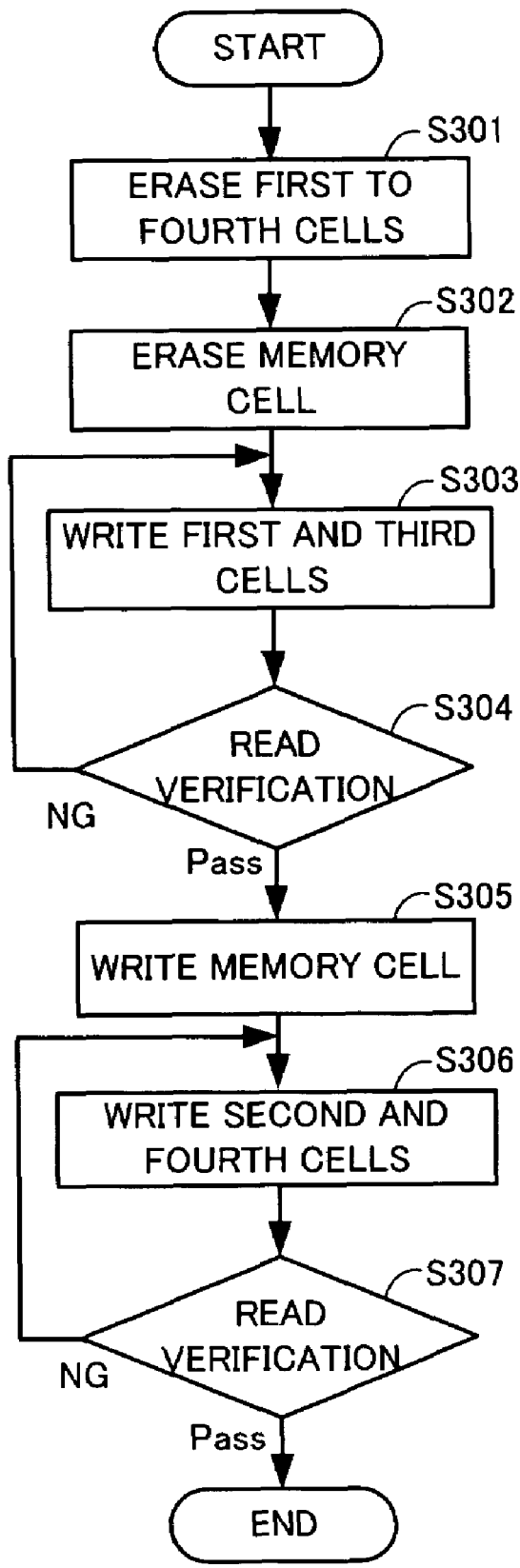
FIG. 27 is a flowchart illustrating a method of setting a state of a reference cell in the flash EEPROM of the fifth embodiment of the present invention.
Figure 28:
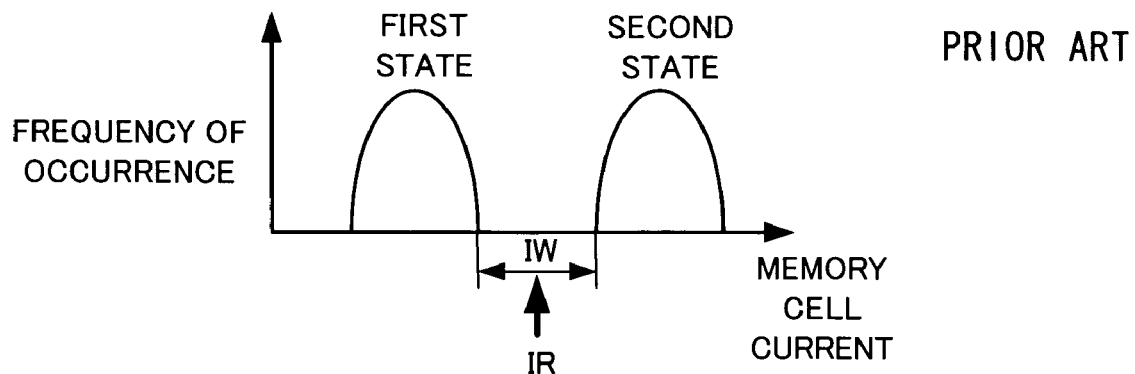
FIG. 28 is a diagram illustrating a memory cell current distribution and a read reference (first example) in a conventional flash EEPROM.
Figure 29:
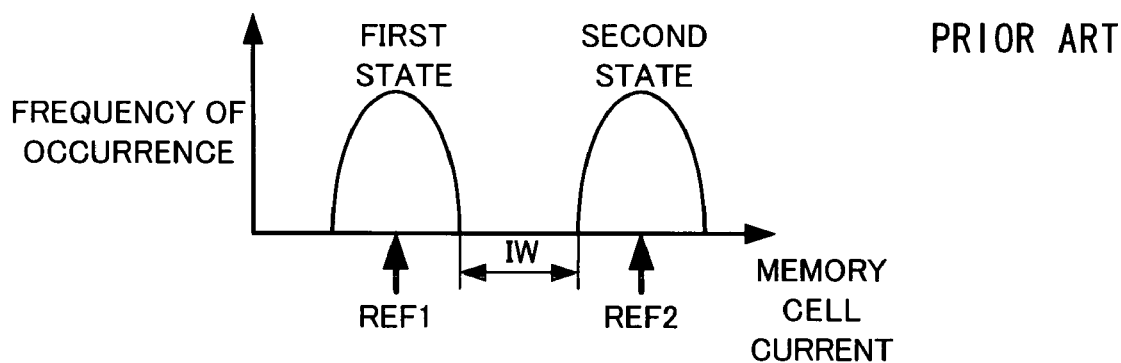
FIG. 29 is a diagram illustrating a memory cell current distribution and a read reference (second example) in a conventional flash EEPROM.
Figure 30:
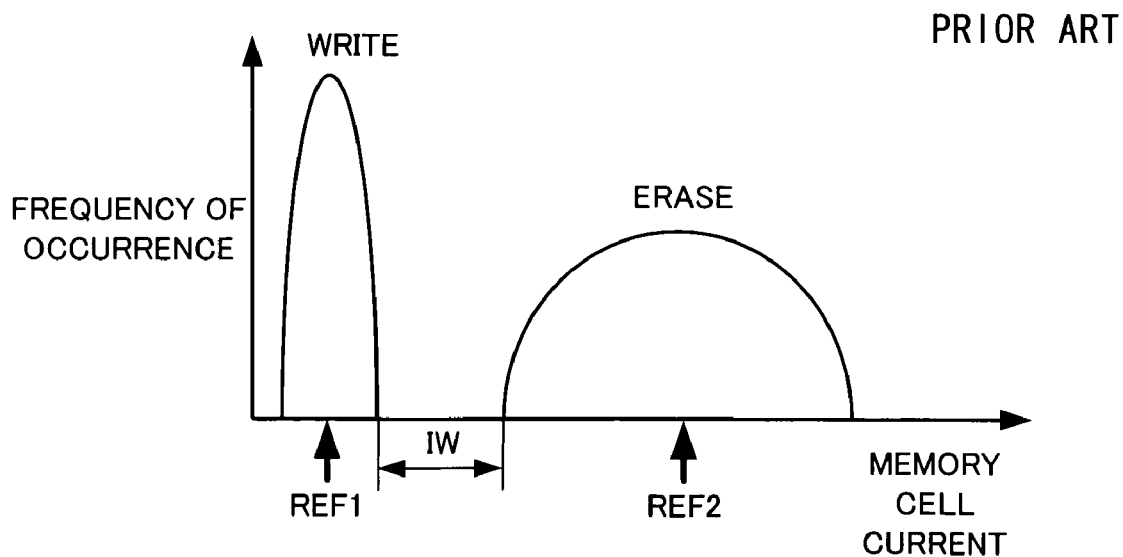
FIG. 30 is a diagram illustrating a memory cell current distribution in a flash EEPROM.

FIG. 27 is a flowchart illustrating a method of setting a state of a reference cell related to a binary memory block in the flash EEPROM of the fifth embodiment. The method of FIG. 27 is the same as the reference cell state setting method of the first embodiment (FIG. 10), except that a write operation is performed with respect to the first and third cells in step S303 and a write operation is performed with respect to the second and fourth cells in step S306. It will be clearly understood from the description of the first embodiment that a read reference can be set as illustrated in FIG. 26B by the method of FIG. 27.

In the flash EEPROM of the fifth embodiment, both a read operation with respect to a memory cell in the four-valued memory block and a read operation with respect to a memory cell in the binary memory block are performed using the multi-valued read section 408 (FIG. 23). As described above, in the multi-valued read section 408, the read circuit 56 compares a current having the same amount as a memory cell current with a current (IREF1+IREF2)/2; the read circuit 57 compares a current having the same amount as a memory cell current with a current (IREF2+IREF3)/2; and the read circuit 58 compares a current having the same amount as a memory cell current with a current (IREF3+IREF4)/2. As described above, the multi-valued read section 408 can be used to correctly read four-valued data.

When a memory cell in the binary memory block is read out, the current IREF1 coincides with the current IREF3, while the current IREF2 coincides with the current IREF4. Therefore, the read circuits 56 to 58 each compare a current having the same amount as a memory cell current with the current (IREF1+IREF2)/2 and output the same comparison result. Therefore, the encoding results D1 and D0 output from the encoder 59 are either both 0 or both 1. Therefore, when a memory cell in the binary memory block is read out, the multi-valued read section 408 can be used to correctly read binary data.

As described above, according to the flash EEPROM of the fifth embodiment, by switching a read reference cell setting method between the binary memory block and the four-valued memory block, a portion of the flash EEPROM can be used as a binary memory, while the remaining portion can be used as a four-valued memory, without adding a particular circuit.

The first to fifth embodiments of the present invention have been heretofore described. In addition, various semiconductor memory devices which have the features of the present invention can be contemplated. For example, in the flash EEPROMs of the second to fifth embodiments, a read circuit which compares a current having an amount two times that of a memory cell current with a sum of memory cell currents of two reference cells can be employed in place of a read circuit which compares a half of a memory cell current with memory cell currents of two reference cells, as in the first embodiment.

In the flash EEPROMs of the second to fifth embodiments, when a state of a reference cell is set, a memory cell current of a reference cell does not have to completely coincide with a maximum value, a minimum value or a representative value (median, average, most frequent value) of a memory cell in each state, i.e., an error between them is permitted to some extent.

In the first to fifth embodiments, flash EEPROMs are described as examples. According to a similar principle, a non-volatile semiconductor memory device other than a flash EEPROM can be constructed.

While the invention has been described in detail, the foregoing description is in all aspects illustrative and not restrictive. It is understood that numerous other modifications and variations can be devised without departing from the scope of the invention.

What is claimed is:

1. A method for reading data, in a non-volatile semiconductor memory device comprising a plurality of memory cells, from the memory cell set in one of at least two states, the method comprising the steps of:
    obtaining a read current of the memory cell to be read as a first current;
    obtaining a second current based on a first verification reference current used for erase verification of the memory cell and a second verification reference current used for write verification of the memory cell; and
    calculating data stored in the memory cell to be read, depending on whether the first current is larger than, smaller than, or equal to the second current.

2. The method according to claim 1, wherein
    the step of obtaining the second current includes obtaining a sum current of the first verification reference current and the second verification reference current as the second current, and
    the step of calculating the data includes comparing the first current with a half of the second current.

3. The method according to claim 1, wherein
    the step of obtaining the second current includes obtaining a sum current of the first verification reference current and the second verification reference current as the second current, and
    the step of calculating the data includes comparing a double of the first current with the second current.

4. A circuit for reading data from a non-volatile semiconductor memory device comprising a plurality of memory cells, the circuit comprising:
    a first current generation circuit of generating a first verification reference current used for erase verification of the memory cell;
    a second current generation circuit of generating a second verification reference current used for write verification of the memory cell;
    a first current supply circuit of supplying a read current as a first current to the memory cell to be read;
    a second current supply circuit of supplying a second current based on the first verification reference current and the second verification reference current; and
    a comparison section of calculating data stored in the memory cell to be read, depending on whether the first current is larger than, smaller than, or equal to the second current.

5. The circuit according to claim 4, wherein
    the second current supply circuit supplies a sum current of the first verification reference current and the second verification reference current as the second current, and
    the comparison section comprises:
        a third current supply circuit of supplying a third current corresponding to the first current;
        a fourth current supply circuit of supplying a fourth current corresponding to the second current; and
        a comparison circuit of comparing the third current with the fourth current.

6. The read circuit according to claim 5, wherein
    the third current has the same amount as that of the first current, and the fourth current is a half of the second current.

7. The read circuit according to claim 5, wherein
    the third current is a double of the first current, and the fourth current has the same amount as that of the second current.

8. A method for reading data, in a non-volatile semiconductor memory device comprising a plurality of memory cells and a plurality of reference cells, from the memory cell set in one of at least two states, wherein a first reference cell is set so that a read current thereof coincides with a maximum or minimum value of a read current of the memory cell set in a first state, and a second reference cell is set so that a read current thereof coincides with a maximum or minimum value of a read current of the memory cell set in a second state, the method comprising the steps of:

obtaining a read current of the memory cell to be read as a first current;

obtaining a second current based on the read current of the first reference cell and the read current of the second reference cell; and calculating data stored in the memory cell to be read, depending on whether the first current is larger than, smaller than, or equal to the second current.

9. The method according to claim 8, wherein the step of obtaining the second current includes obtaining a sum current of the read current of the first reference cell and the read current of the second reference cell as the second current, and the step of calculating the data includes comparing the first current with a half of the second current.

10. The method according to claim 8, wherein the step of obtaining the second current includes obtaining a sum current of the read current of the first reference cell and the read current of the second reference cell as the second current, and the step of calculating the data includes comparing a double of the first current with the second current.

11. A method for reading data, in a non-volatile semiconductor memory device comprising a plurality of memory cells and a plurality of reference cells, from the memory cell set in one of at least three states, wherein a first one of the reference cells is set so that a read current thereof coincides with a maximum or minimum value of a read current of the memory cell set in a first state, a second one of the reference cells is set so that a read current thereof coincides with a maximum or minimum value of a read current of the memory cell set in a second state, and the remaining reference cell or cells are set so that a read current thereof coincides with a predetermined value, the method comprising the steps of:

obtaining a read current of the memory cell to be read as a first current;

obtaining a second current based on the read current of the first reference cell and the read current of the second reference cell;

obtaining a third current based on read currents of two of the reference cells other than the first reference cell;

calculating a first comparison result, depending on whether the first current is larger than, smaller than, or equal to the second current;

calculating a second comparison result, depending on whether the first current is larger than, smaller than, or equal to the third current; and calculating data stored in the memory cell to be read based on the first comparison result and the second comparison result.

12. The method according to claim 11, wherein the non-volatile semiconductor memory device comprises at least four reference cells, a third one of the reference cells is set so that a read current thereof coincides with a maximum or minimum value of a read current of the memory cell set in the second state, a fourth one of the reference cells is set so that a read current thereof coincides with a maximum or minimum value of a read current of the memory cell set in a third state, the step of obtaining the second current includes obtaining a sum current of the read current of the first reference cell and the read current of the second reference cell as the second current, and the step of obtaining the third current includes obtaining a sum current of the read current of the third reference cell and the read current of the fourth reference cell as the third current.

13. The method according to claim 11, wherein the non-volatile semiconductor memory device comprises at least four reference cells, a third one of the reference cells is set so that a read current thereof coincides with a representative value of a read current of the memory cell set in the second state, a fourth one of the reference cells is set so that a read current thereof coincides with a representative value of a read current of the memory cell set in a third state, the step of obtaining the second current includes obtaining a sum current of the read current of the first reference cell and the read current of the second reference cell as the second current, and the step of obtaining the third current includes obtaining a sum current of the read current of the third reference cell and the read current of the fourth reference cell as the third current.

14. The method according to claim 11, wherein the non-volatile semiconductor memory device comprises at least three reference cells, a third one of the reference cells is set so that a read current thereof coincides with a maximum or minimum value of a read current of the memory cell set in a third state, the step of obtaining the second current includes obtaining a sum current of the read current of the first reference cell and the read current of the second reference cell as the second current, and the step of obtaining the third current includes obtaining a sum current of the read current of the second reference cell and the read current of the third reference cell as the third current.

15. The method according to claim 11, wherein the step of calculating the first comparison result includes comparing the first current with a half of the second current, and the step of calculating the second comparison result includes comparing the first current with a half of the third current.

16. The method according to claim 11, wherein the step of calculating the first comparison result includes comparing a double of the first current with the second current, and the step of calculating the second comparison result includes comparing a double of the first current with the third current.

17. A circuit for reading data from a non-volatile semiconductor memory device comprising a plurality of memory cells, the circuit comprising:

a first reference cell set so that a read current thereof coincides with a maximum or minimum value of a read current of the memory cell set in a first state;

a second reference cell set so that a read current thereof coincides with a maximum or minimum value of a read current of the memory cell set in a second state;

a first current supply circuit of supplying a read current as a first current to the memory cell to be read;

a second current supply circuit of supplying a second current based on the read current of the first reference cell and the read current of the second reference cell; and a comparison section of calculating data stored in the memory cell to be read, depending on whether the first current is larger than, smaller than, or equal to the second current.

18. The circuit according to claim 17, wherein the second current supply circuit supplies, as the second current, a sum current of the read current of the first reference cell and the read current of the second reference cell, and the comparison section comprises:
- a third current supply circuit of supplying a third current corresponding to the first current;
- a fourth current supply circuit of supplying a fourth current corresponding to the second current; and
- a comparison circuit of comparing the third current with the fourth current.

19. The circuit according to claim 18, wherein the third current has the same amount as that of the first current, and the fourth current is a half of the second current.

20. The circuit according to claim 18, wherein the third current is a double of the first current, and the fourth current has the same amount as that of the second current.

21. A method for reading data, in a non-volatile semiconductor memory device comprising a plurality of memory cells and a plurality of reference cells, from the memory cell, wherein the memory cells are divided into a first type such that the memory cell is set to be one of at least four states on a block-by-block basis, and a second type such that the memory cell is set to be one of at least two states, each memory cell block is associated with at least four reference cells, the first to fourth reference cells of the first type memory cell are set so that respective read currents coincide with a maximum or minimum value of a read current of a memory cell set in one of the four states, the first and third reference cells of the second type memory cell are set so that respective read currents coincide with a maximum or minimum value of a read current of a memory cell set in one of the two states, and the second and fourth reference cells of the second type memory cell are set so that respective read currents coincide with a maximum or minimum value of a read current of a memory cell set in the other of the two states, the method comprising the steps of:
- obtaining a read current of the memory cell to be read as a first current;
- obtaining a second current based on the read current of the first reference cell and the read current of the second reference cell;
- obtaining a third current based on the read current of the second reference cell and the read current of the third reference cell;
- obtaining a fourth current based on the read current of the third reference cell and the read current of the fourth reference cell; and
- calculating data stored in the memory cell to be read, depending on whether the first current is larger than, smaller than, or equal to the second to fourth currents.

* * * * *